(12) United States Patent
McClain

(10) Patent No.: US 8,913,754 B2
(45) Date of Patent: Dec. 16, 2014

(54) SYSTEM FOR DYNAMIC SPECTRAL CORRECTION OF AUDIO SIGNALS TO COMPENSATE FOR AMBIENT NOISE

(75) Inventor: David McClain, Tucson, AZ (US)

(73) Assignee: Sound Enhancement Technology, LLC, Tucson, AZ (US)

( * ) Notice: Subject to any disclaimer, the term of this patent is extended or adjusted under 35 U.S.C. 154(b) by 368 days.

(21) Appl. No.: 13/489,255

(22) Filed: Jun. 5, 2012

(65) Prior Publication Data

US 2013/0136266 A1    May 30, 2013

Related U.S. Application Data

(60) Provisional application No. 61/564,942, filed on Nov. 30, 2011, provisional application No. 61/564,945, filed on Nov. 30, 2011.

(51) Int. Cl.
*H03G 3/20*     (2006.01)
*H03G 7/00*     (2006.01)

(52) U.S. Cl.
USPC .............................................. 381/57; 381/106

(58) Field of Classification Search
CPC .............................. H03G 3/32; G10L 19/0204
USPC ............ 381/57, 71.1–71.12, 94.1–9, 86, 106; 704/500, E21.001; 455/63, 432.3; 700/94
See application file for complete search history.

(56) References Cited

U.S. PATENT DOCUMENTS

| | | | |
|---|---|---|---|
| 3,939,310 A | 2/1976 | Hodges | |
| 6,011,853 A | 1/2000 | Koski et al. | |
| 6,674,868 B1 | 1/2004 | Narusawa | |
| 6,768,798 B1 | 7/2004 | Dempsey | |
| 7,529,545 B2 | 5/2009 | Rader et al. | |
| 7,877,062 B2 | 1/2011 | Wong et al. | |
| 2004/0086129 A1 | 5/2004 | Schobben et al. | |
| 2005/0069160 A1 | 3/2005 | Kehoe | |
| 2005/0135635 A1* | 6/2005 | Prince | 381/86 |
| 2005/0135644 A1 | 6/2005 | Qi | |
| 2005/0260985 A1 | 11/2005 | Rader et al. | |
| 2006/0025994 A1 | 2/2006 | Christoph | |
| 2008/0137874 A1* | 6/2008 | Christoph | 381/57 |
| 2008/0219459 A1 | 9/2008 | Bongiovi et al. | |
| 2008/0240478 A1 | 10/2008 | Messmer et al. | |
| 2008/0269926 A1 | 10/2008 | Xiang et al. | |
| 2008/0304683 A1 | 12/2008 | Kuo | |
| 2008/0310658 A1 | 12/2008 | Kuo | |
| 2009/0089054 A1* | 4/2009 | Wang et al. | 704/233 |
| 2010/0020988 A1 | 1/2010 | McLeod | |
| 2010/0056227 A1 | 3/2010 | Hayakawa et al. | |
| 2011/0255712 A1 | 10/2011 | Urata | |

\* cited by examiner

*Primary Examiner* — Vivian Chin
*Assistant Examiner* — Ammar Hamid

(57) ABSTRACT

The present invention features systems for adjusting audio signals by applying a gain to the signal in a spectrally varying manner to compensate for ambient noise in the environment of the listener. The system allows a listener to hear what ought to be heard, over the ambient noise, by applying a gain to the source that varies according to the spectral composition of the noise, rather than cancelling or filtering the noise. The spectral composition of the source is thus preserved in the listener's awareness without the removal of the noise signal. After application of these corrective gains to the source, the listener's perception of the source sound is as if the noise was not present. Systems may be incorporated into apparatuses including but not limited to mobile phones and music players.

20 Claims, 9 Drawing Sheets

System Architecture using parallel compression to implement non-linear psychoacoustic dynamic range compression for ambient noise compensation.

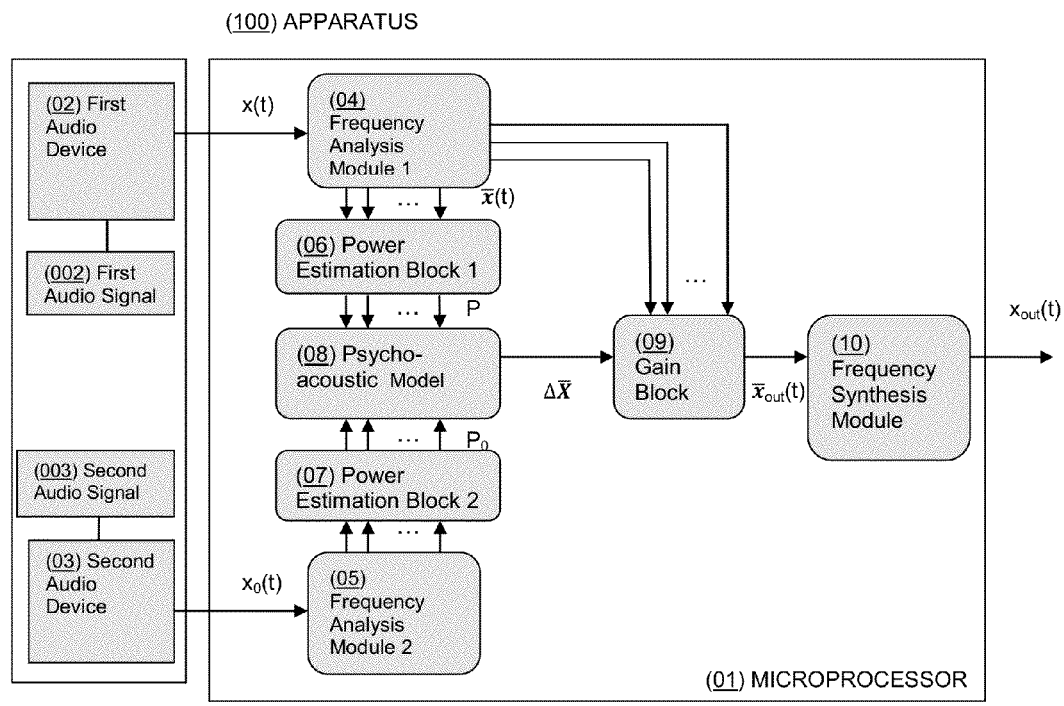
FIG. 1. Microprocessor hardware implementation of ambient noise correction system

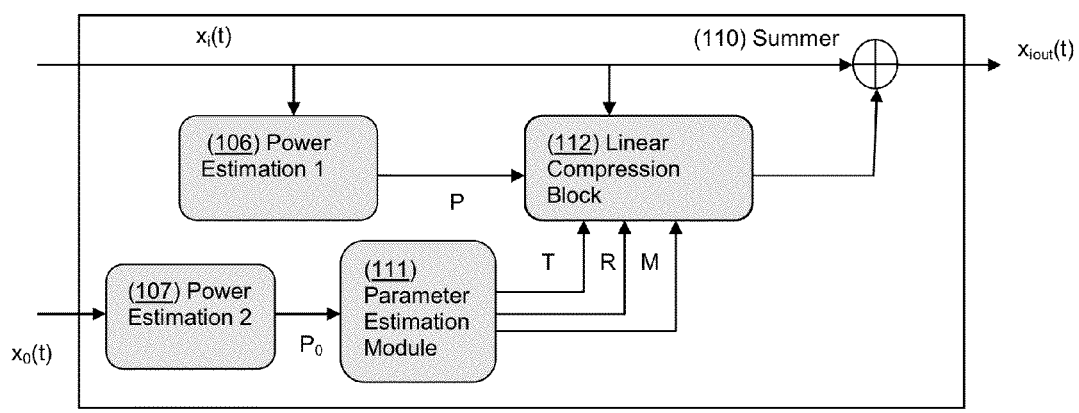
FIG. 2. Parallel Compression Approximation to Psychoacoustic Model for a subband

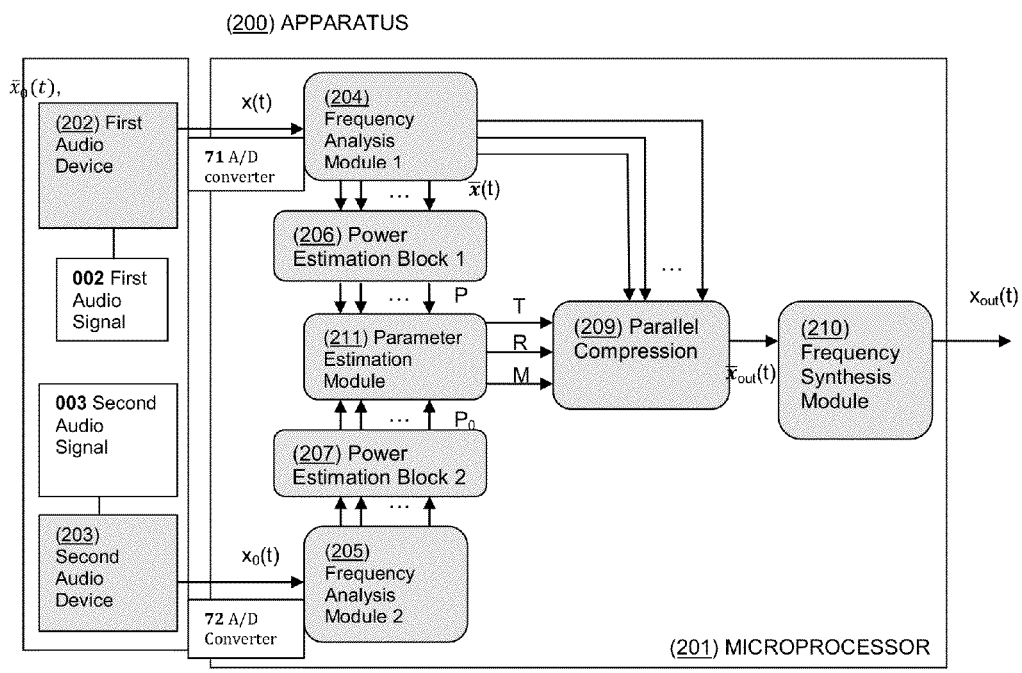
FIG. 3. System Architecture using parallel compression to implement non-linear psychoacoustic dynamic range compression for ambient noise compensation.

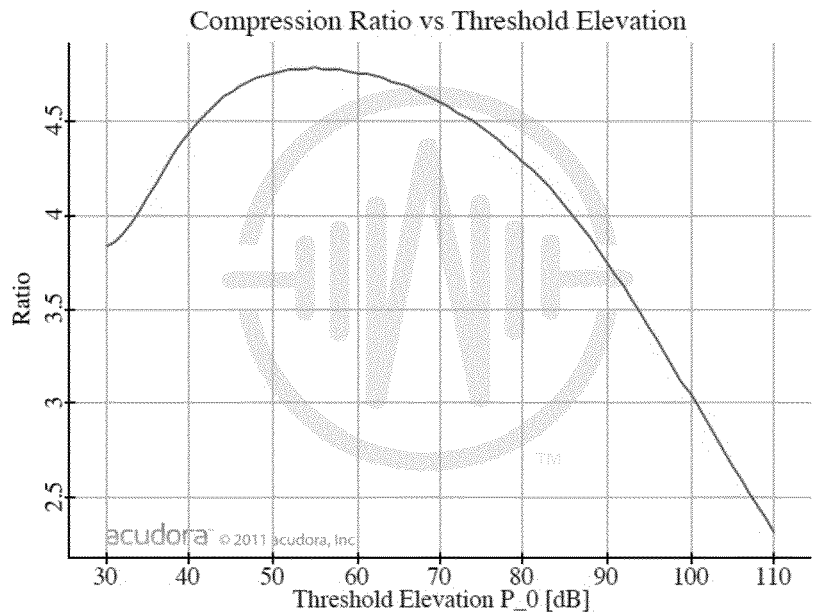
FIG. 4. Compression Ratio vs. Threshold Elevation match to Psychoacoustic model
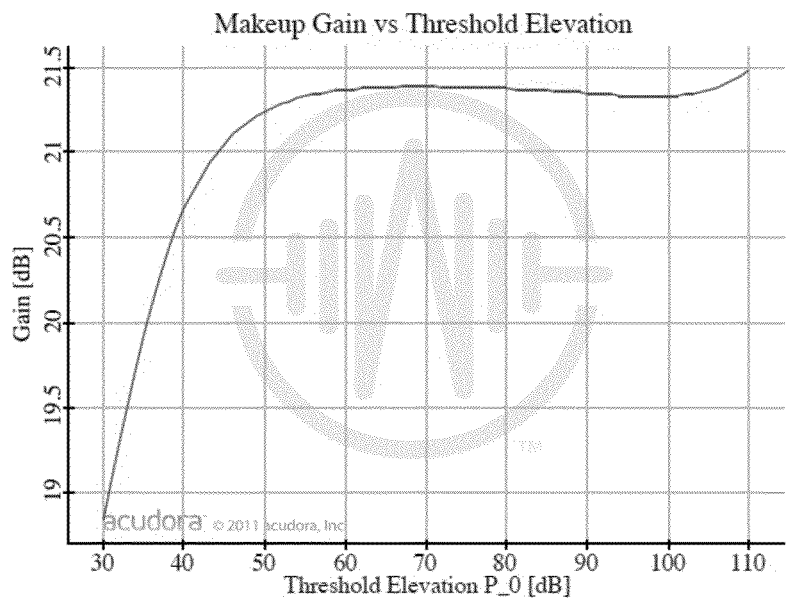
FIG. 5. Makeup Gain vs. Threshold Elevation match to Psychoacoustic model

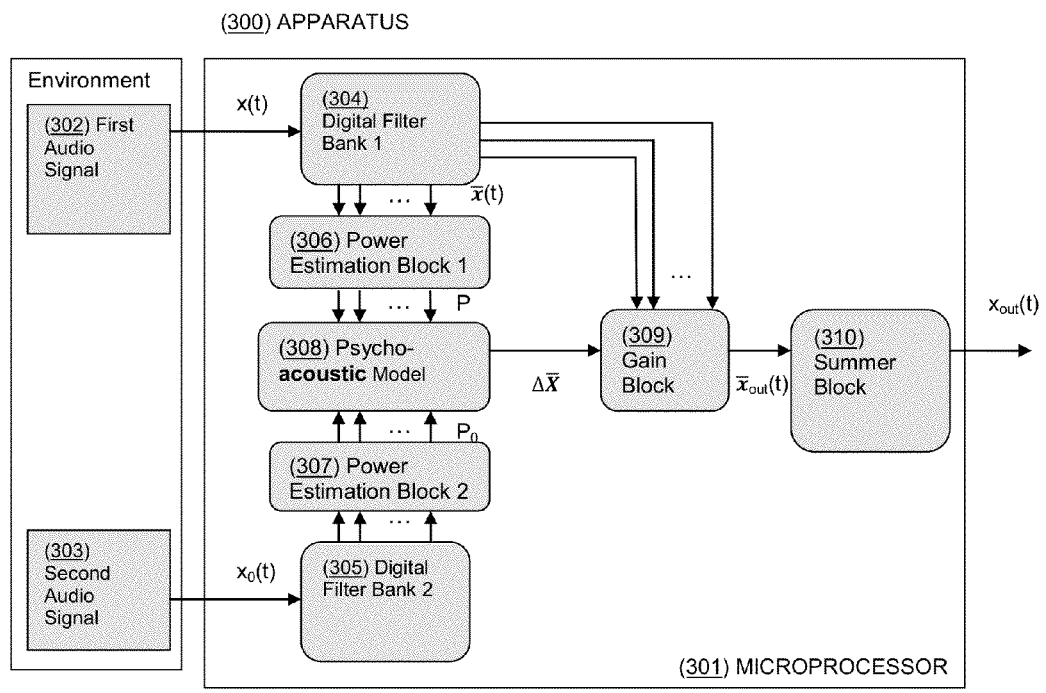
FIG. 6. Microprocessor Digital Implementation

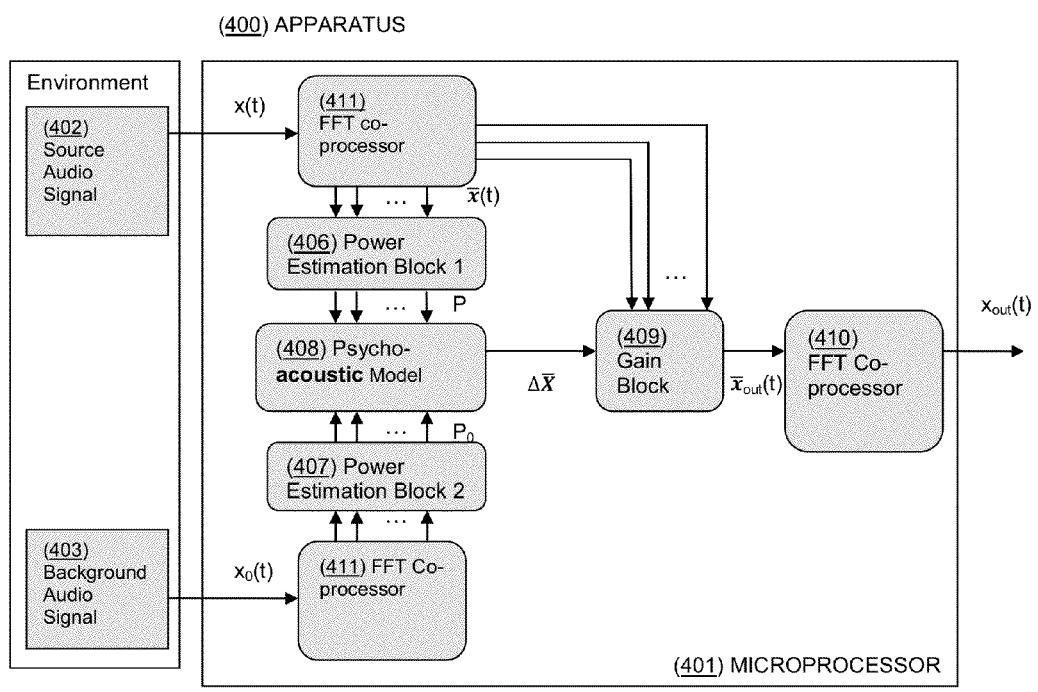
FIG. 7. Microprocessor Digital Implementation with FFT Co-processor

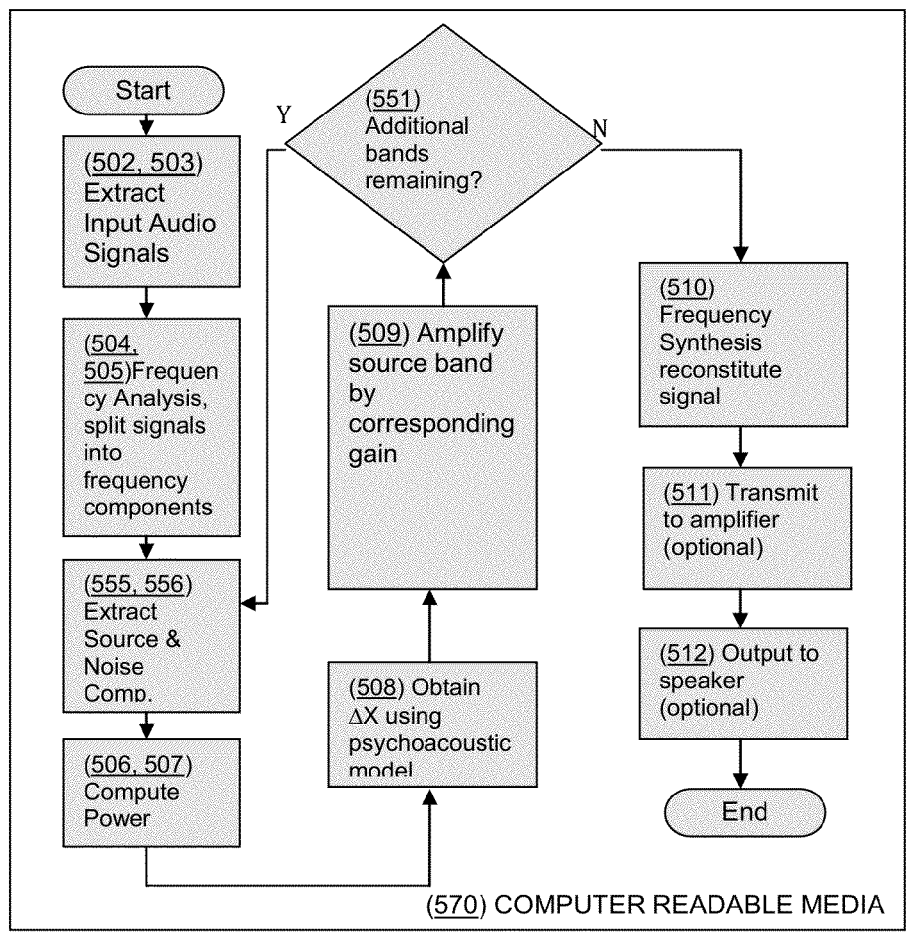
FIG. 8. Software process flow implementation of corrective system

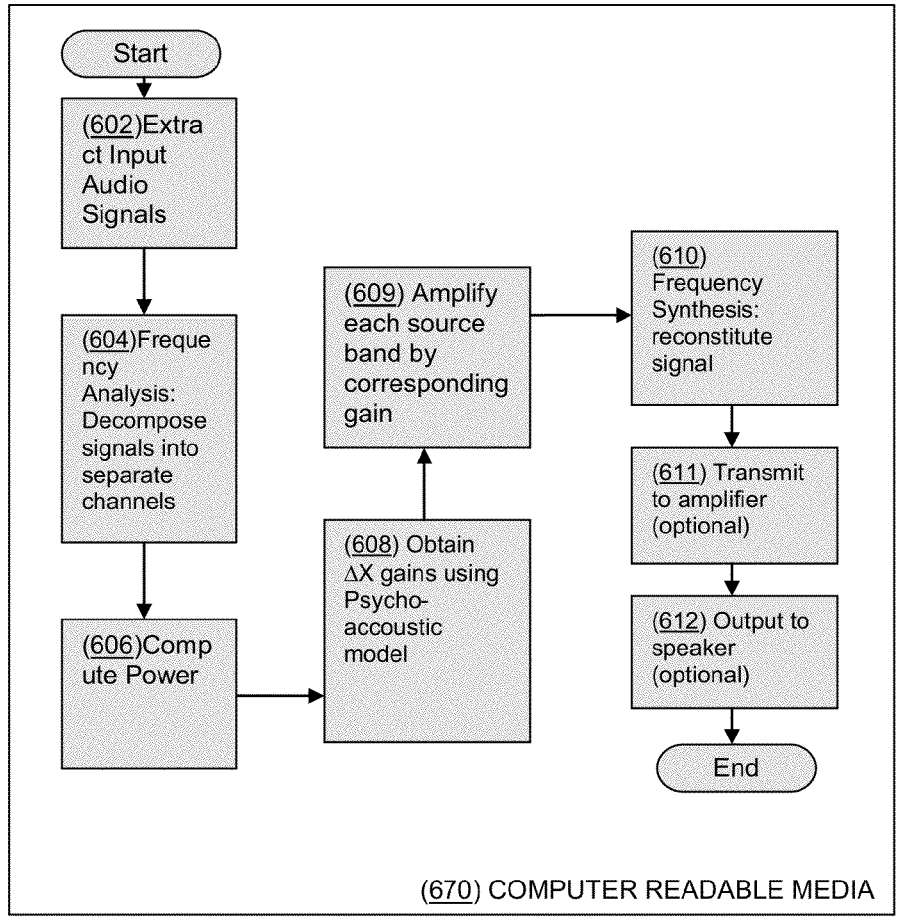
FIG. 9. Parallel processing process flow of corrective system

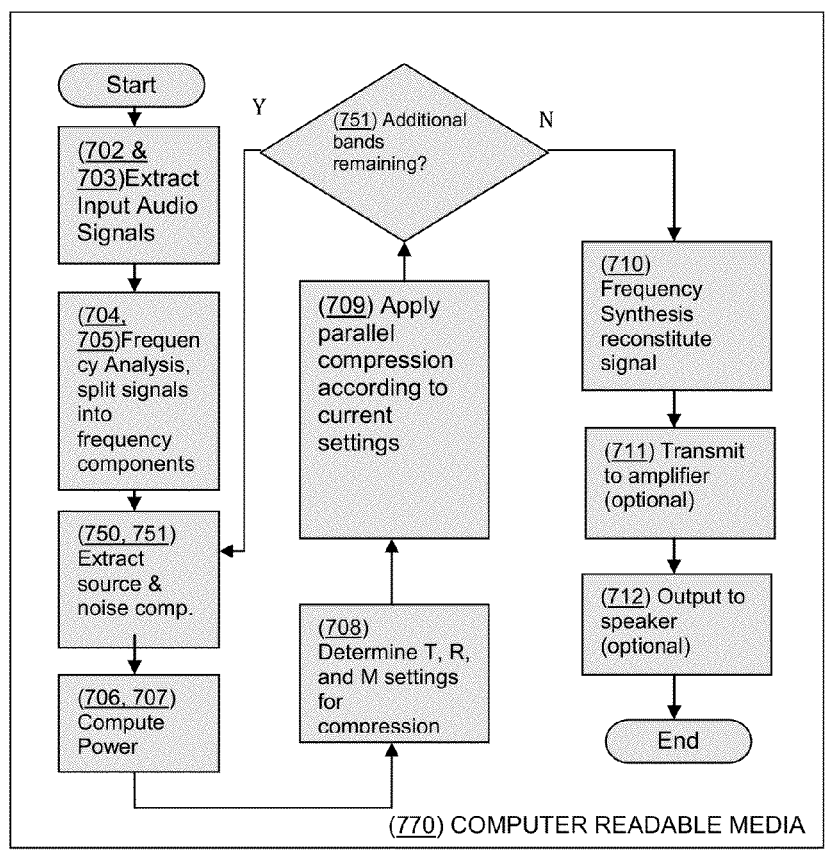
FIG. 10. Parallel processing process flow of corrective system, using parallel compression to approximate the desired compression curves

SYSTEM FOR DYNAMIC SPECTRAL CORRECTION OF AUDIO SIGNALS TO COMPENSATE FOR AMBIENT NOISE

CROSS REFERENCE

The present non-provisional patent application claims benefit to the earlier priority date of provisional patent application Ser. No. 61/564,945, filed Nov. 30, 2011, and application Ser. No. 61/564,942, filed Nov. 30, 2011, the disclosures of which are incorporated in their entirety herein by reference.

BACKGROUND OF THE INVENTION

The present invention relates to the field of audio processing and more specifically to compensation for ambient noise in the listener's environment.

There are many systems for the application of filtering to noise suppression in an audio signal. In general, these inventions relate to the removal of noise present in a source signal from an origin or introduced into the signal through processing and transmission. Various forms of filtering may be applied which suppresses the noise signal in whole or in part, removing it from the source signal. Generally, these systems have adverse impacts upon the quality of the original signal. Further, these systems do not address noise in the environment of the listener, which cannot be filtered.

Conversely, some systems for the suppression of noise in the listener's environment also exist. These systems generally use noise cancellation to remove the disrupting external signal by adding sound projected through headphones which has the effect of countering the sound waves produced by the noise. In this case, the noise is completely canceled and the listener is generally unaware of the existence of the external noise—a result which can reduce the awareness of the listener to potential dangers in the environment.

In some prior art systems, dynamic volume compensation may be used to raise the volume of a source signal of interest over ambient background noise. However, these systems increase the gain in a spectrally uniform manner, raising the volume of all frequency components uniformly. This effect can distort the perception of music and speech due to the non-linear behavior of the human ear with respect to frequency and volume, and raise the volume to excessive levels.

Microphones and mechanical systems (e.g., computer software) can measure dBSPL, i.e., Decibels in sound power. A sound (e.g., 40 dBSPL) at a particular frequency (e.g., 1 kHz) sounds just as loud as the sound (e.g., 40 dBSPL) at a different frequency (e.g., 4 kHz) to a microphone or mechanical system. However, our hearing can be affected by the mechanical construction of our outer ear and/or slow variation in sensitivity across the basilar membrane due to fluid damping of the incident waves in the cochlear fluid. The variable sensitivity of human hearing is reflected in the Fletcher-Munson equal loudness contours and the equal-loudness contours from ISO 226:3003 revision. These contours show that perceived loudness varies according to the frequency and volume of the sound.

Since the human ear dynamically adjusts to sound intensity levels, the presence of background noise alters the threshold at which sounds begin to be perceived. As a result, ambient noise at a given frequency may make sounds at those frequencies that would otherwise be perceptible imperceptible in the presence of ambient noise. In order for the sound to be heard, it must be amplified over the background noise. The volume of the ambient noise therefore represents a degree of hearing impairment or baseline threshold elevation over which the sound must be amplified in order to be perceived.

This effect varies according to the spectral composition of the noise, that is, spectral components that are sufficiently far from the spectral composition of the noise will remain perceptible. Consequently, using the total intensity of the background noise to raise the intensity of the source uniformly will overly amplify bands which are not affected, possibly raising the volume to damaging levels. In order to amplify only those components which need compensation, the gains to the source signal must vary by spectral band, according to the spectral composition of the noise.

Moreover, due to the nonlinear response of the human ear, using the spectral intensity of the background noise at a particular band as the gain for the source at that band will produce excessive amplification. In order to compute the correct gain, a psychoacoustic model must be used to compute an appropriate gain for each frequency or band frequency. The psychoacoustic model is a mathematical representation of the dynamic behavior of the human ear, in terms of perceived loudness as a function of sound intensity. The intensity of the background noise as well as the source signal at a given frequency are inputs to this model, and the output is a desired gain for the source signal at that frequency or frequency band.

In the music industry, techniques such as parallel compression (commonly called New York Compression) have long been used to dynamically adjust the volume of quieter content in music in order to improve aesthetic qualities by bringing sub-threshold content above the hearing threshold. Parallel compression involves applying a linear gain to a signal which amplifies softer sounds and subsequently adding this amplified sound back in to the original signal. The result is generally a non-linear compression that amplifies softer tones without affecting the louder ones.

Parallel compression depends on a number of parameters including a threshold, which determines when the gain begins to fall off, as well as a compression ratio, and a makeup gain which adds an additional flat gain to match the final volume of the adjusted signal with the original signal. Usually these are fixed settings applied to a track, not dynamically adjusted over the course of the time. Parallel compression is also usually applied to a single signal band rather than used to perform multi-band compression.

The present invention features systems for dynamically adjusting audio signals by applying a gain to the signal in a spectrally varying manner to compensate for a noise source in the environment of the listener. The system obtains a threshold elevation for each frequency component by analyzing the spectral composition of the ambient noise. This threshold elevation is then used by a psychoacoustic model to determine an appropriate gain adjustment for the corresponding frequency component of the source signal. After applying the gains to the source signal, the system outputs the resulting signal to the speaker. The system allows a listener to hear the source signal over ambient noise, by applying a gain to the source that varies according to the spectral composition of the noise, rather than cancelling the noise, or applying a uniform volume adjustment to the source. The source is thus amplified without the removal of the noise signal, and without excessive volume increases. Systems may be incorporated into apparatuses including but not limited to mobile phones and music players.

The present invention utilizes parallel compression (New York compression) in its implementation, by dynamically altering the compression ratio, makeup gain, and threshold so as to approximate the compression curve determined according to the psychoacoustic model. In prior art uses of New York compression, these parameters are generally fixed throughout a track and dynamic adjustment of these parameters has not previously been conceived of to correct for ambient noise. Furthermore, use of parallel compression to approximate a function demanded by a psychoacoustic model is an entirely novel use of these techniques. The present invention thus applies existing techniques in a unique and novel way to create a unique and novel system for correcting for ambient noise.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description.

GLOSSARY OF TERMS

THE FOLLOWING INFORMATION REGARDING TERMS IS NON-LIMITING AND EXEMPLARY IN NATURE FOR THE PURPOSE OF UNDERSTANDING THE SPIRIT OF THE INVENTION

1. Amplifier: This component can be any amplifier or related device capable of applying gains to an audio signal.
2. Audio Codec: Audio Encoder/Decoder converts an audio signal to and from its encoded format either for storing in a file or transmission over a network
3. A/D Converter: Converts audio signals from analog to digital format. In some embodiments, the term A/D Converter is used interchangeably with a means for converting an audio signal from analog to digital form. Analog-to-digital and digital-to-analog converters can be assumed to exist at interface points between analog elements and digital elements of any embodiment. Said means may be electronic, non-electronic or only partially electronic. Said converters, also commonly referred to as Analog to Digital Converters or ADCS, are well known within the art and would be understood by one skilled in the same. Said converters could include but are not limited to direct-conversion ADCs, successive approximation ADCs, a ramp-compare ADC, Wilkinson ADCs, integrating ADCs, Delta-encoded ADCs, pipeline ADCs, time interleaved ADCs, or ADCs with intermediate FM Stage
4. Audio Device: As used herein, an audio device is any audio device capable of extracting, storing or receiving an audio signal. In some embodiments, the term audio device is used interchangeably with a "means for extracting and/or identifying an audio signal of interest and/or ambient noise signal." Said means may be, for example, a microphone, receiver, or storage media containing a signal of interest in an audio file and code for reading the signal from an audio file.
5. Audiogram: One form of defining a person's hearing loss which plots thresholds of hearing relative to a standardized curve that represents 'normal' hearing, in dB(HL). An audiogram can be obtained using a behavioral hearing test called Audiometry. The "Tone" test involves presenting different tones at a specific frequency (pitch) and intensity (loudness) and determining thresholds of hearing for each tone where the thresholds correspond to how loud the tone must be presented in order for the person to perceive the tone sound.
6. Audio Jack: An input by which an audio signal can be received. i.e. from a microphone.
7. Background signal: The background signal, as used herein, refers to a portion of the second audio signal or the ambient noise signal at the same frequency component as that of the source signal. The source signal and the background signal are paired.
8. Calibration equation: Calibration comprises configuring a microprocessor to calculate and interpret a baseline relationship between dBFS and dBPSL such that a zero point in dBSPL can be computed. It is represented by: $P_{dbSPL}(F) = P_{dBFS}(F) + (P_{dBSPL_0}(F) - P_{dBFS_0}(F))$ wherein $P_{dBSPL0}$ is nominally a value between 65 and 83, and wherein $P_{dBFS0}$ is nominally a value between −20 and −12;

where

P=Phons amplitude of a source signal of interest

F=Frequency dBSPL=decibels according to sound pressure dBFS=decibels relative to full scale
9. Bark frequency: The bark scale is a psychoacoustic scale for subjective measurements of loudness. The scale is broken down into critical bands of hearing. Critical bands are known frequency bandwidths that correspond to limitations of the human ear to perceive sounds with frequency differences smaller than the critical bandwidths.
10. D/A Converter: Converts audio signals from digital to analog format. In some embodiments, the term D/A Converter is used interchangeably with a means for converting an audio signal from digital to analog form. Analog-to-digital and digital-to-analog converters can be assumed to exist at interface points between analog elements and digital elements of any embodiment. A D/A converter, or DAC, is capable of converting a digital, usually binary signal code to an analog signal (current voltage or electric charge). DACs may include but are not limited to pulse width modulators, oversampling or interpolating DACs, binary weighted DACs, R-2R Ladder DACs, Successive approximation or cyclic DACs, thermometer coded DACs, and hybrid DACs.
11. Digital Signal Processor ("DSP") Chip: A specialized microprocessor with an architecture for the fast operational needs of digital signal processing.
12. FFT Co-Processor: A specialized microprocessor designed for the purpose of rapidly computing Fourier transforms using a algorithm for computing Fourier transforms commonly known as the 'Fast Fourier Transform' (FFT).
13. Field Programmable Gate Array ("FPGA"): a reprogrammable electronic chip.
14. Filter banks: An array of band-pass filters that separate an input signal into multiple components, or as used herein, frequency components, each frequency component carrying a single frequency subband of the original signal.
15. FIR Filter: A filter with an impulse response (or response to any finite length input) of finite duration, because it settles to zero in finite time. This is in contrast to infinite impulse response (IIR) filters, which have internal feedback and may continue to respond indefinitely (usually decaying). FIR filters can be discrete-time or continuous-time, and digital or analog.
16. Fourier transforms: A mathematical operation that computes the frequency content of an audio signal, taking a given audio signal as input and outputting magnitudes and phases across the frequency spectrum.

17. Frequency Analysis Model: This model can use a variety of known methods to divide the audio signal of interest into a plurality of frequency components. Such methods may include, but are not limited to methods such as filter banks, Fourier transforms, wavelet transforms or other signal processing techniques. In some embodiments, the term Frequency Analysis Model is used interchangeably with a "means for dividing an audio signal into a plurality of frequency components. Said means may be, for example, a digital filter bank, analog filter bank, FFT Co-processor, or code for computing a Fourier transform analysis to an audio signal on computer-readable media.
18. Frequency component and Frequency Component Spectrum: A frequency component, as used herein, identifies a portion of the frequency range of an audio signal. A frequency component may comprise a particular, individual frequency, frequency channels, or frequency bands. A frequency component spectrum is a plurality of frequency components.
19. Frequency Synthesis Module: A module which the present invention can use to reconstitute the various frequency components of a particular audio signal of interest. The frequency synthesis Module may perform summation of the various frequency components of the signal of interest, or may perform an inverse Fourier transform, or other transform, after said frequency components have been adjusted, to create a new signal or waveform, depending on whether the Frequency analysis module was a filter bank or a fourier transform, or other transform. "Sound Systems: Design and Optimization: Modern Techniques and Tools for Sound System Design and Alignment", McCarthy, Bob (2010) (Focal Press) Second Edition. In some embodiments, the term Frequency Synthesis Module is used interchangeably with a "means for reconstituting an audio signal". Said means may be, for example, a summer block, a frequency synthesis module, an FFT-Co processor, an inverse FFT transform, or code for implementing an inverse FFT transform on computer-readable media.
20. Gain Block component—This component applies the gains to each corresponding frequency component or band. In some embodiments, the term gain block component is used interchangeably with a "means for applying gains to a audio signal." Said means may be, for example, an amplifier, or gain block component.
21. Infinite Impulse Response ("IIR") Filter: A signal processing filter with an impulse response function that is non-zero over an infinite length of time. May be implemented as either digital or analog IIR filters. IIR filters use fewer computing resources because they use fewer taps.
22. Input Device: An device configured to enable a user to set a parameter b of a personalized sound adjustment model. In some embodiments, the term input device is used interchangeably with "a means for enabling a user to set a parameter b of a personalized sound adjustment model". Said means may be, for example, a physical input device such as a user adjustable input, a knob, a slider, or any combination thereof. Said means may alternatively be an electronic means or a combination of physical hardware and electronics such as graphical user interface. Said means may further be a touch screen configured to accept a user's choice of parameter b. Additional means would be recognized and understood by one skilled in the relevant art.
23. Inverse Fourier Transform: A mathematical operation which computes a time domain signal corresponding to a given frequency spectrum.
24. kHz frequency to critical band center frequency converter: The critical bands of hearing are natural bands in the audio frequency spectrum in the human ear. These bands are characterized by the masking of tones by other tones in the same critical band. There are several experimentally derived frequency scales that attempt to approximate the critical bands including the Bark scale—a psychoacoustic model proposed by Eberhard Zwicker in 1961, and named after Heinrich Barkhausen who proposed the first subjective measurements of loudness. One example of the equation for converting from kHz to critical band frequency is the conversion to Bark frequency:

$$CBR(F_{kHz}) = \frac{26.81}{1 + \frac{1.960}{F_{kHz}}} - 0.53$$

In some embodiments, the term kHz frequency to critical band center frequency converter is used interchangeably with a "means for converting a frequency component or series of frequency components to critical band frequency. Said mean may be, for example, a summer.
25. Linear slope equation: This equation is part of the Personalized sound adjustment model, and is a novel mathematical equation, and one potential embodiment by which threshold elevations are generated for vTuning. In some embodiments, the term Linear Slope equation is used interchangeably with a "means for estimating threshold elevations specific to a particular person." Said means may be, for example, the Linear Slope equation, an audiogram, or a pattern library.
26. Lookup Table: A tabular list of parameters indexed by some given variable, such as signal power. Used by the model to select a parameter or set of parameters depending on the current real-time value of a variable. In some embodiments, the term Lookup Table is used interchangeably with a "means for determining threshold elevations by using a lookup table." Said means may be, for example, computer-readable media code for retrieving a threshold elevation value from a memory device using a user adjustable parameter b and frequency as indexes.
27. Microphone: The microphone can be any microphone or the like capable of receiving an audio signal.
28. Parallel Compression: applying a linear gain to a signal which amplifies softer sounds and subsequently adding this amplified sound back in to the original signal. Also known as New York compression. In some embodiments, the term parallel compression is used interchangeably with a "means for computing and/or applying corrective gains to an audio signal where said gains correspond to threshold elevations, using a combination of parallel compression and known psychoacoustic models" or a "means for using parallel compression to approximate a desired non-linear dynamic range compression curve." Said means can for example, be any known psychoacoustic model such as the model disclosed herein. Said means may for example, be a model where a compression curve defines the output loudness in decibels versus the input loudness in decibels of a signal of interest, wherein the compression is implemented by applying a gain G to the signal of interest according to the following equation:

$$G = g0 + (P-T)*(1/R - 1)$$

where G is the gain in dB to be applied to a frequency component of the signal of interest, P is the sound intensity of the frequency component in dB, g0 is the makeup gain in dB, T is the threshold in dB, and R is the compression ratio of linear compression, whereupon the linearly compressed signal is added together with the original signal of interest, producing a parallel compressed output signal, where the overall amplitude of the input versus the output signal defines a parallel compression curve, where g0, T, and R are thus parameters that vary the shape of the parallel compression curve, and P is the input loudness of the signal of interest. In some embodiments, the term parallel compression is used interchangeably with a "means for applying parallel compression to a signal of interest." Said means may be, for example, a parallel compression chip or combining a compressed signal with an original signal. In some embodiments, parallel compression may be a "means for applying linear compression to a signal." Said means may for example be an amplifier. In some embodiments, the term parallel compression is used interchangeably with a "means for controlling the shape of a parallel compression curve." Said means may be, for example threshold elevations, makeup gains, and compression ratios. In some embodiments, the term parallel compression is used interchangeably with a "means for finding the parameters which best fit a parallel compression curve against a psychoacoustic model". Said means may be, for example, linear regression, least squares fit, and function approximation. In some embodiments, the term parallel compression is used interchangeably with a "means for storing parameters". Said means may be, for example, use of a lookup table, flash memory, hard disk, and long-term memory. In some embodiments, the term parallel compression is used interchangeably with a "means for retrieving the parameters to be applied to a parallel compression module." Said means may be, for example, a lookup table, polynomials, and a parameter estimation module.

29. Parameter: The parameter is a single mathematical value that when input to the Personalized Sound adjustment, may generate a spectrum of threshold elevations.

30. Pattern Library: A numerical library composed of points and values which measure threshold elevations. In some embodiments, the term Pattern Library is used interchangeably with a "means for creating a pattern library for storing threshold elevations." Said means may be, for example, obtaining sample threshold elevation patterns for varying frequency for various typical users (users indexed by b) or computer-readable media code for storing a set of patterns in memory indexed by a user adjustable parameter b and a frequency.

31. Personalized sound adjustment model: A novel mathematical model which enhances sound through a process of non-linear compression. Bark frequency is one of several types of measures of the natural bandwidth of human hearing referred to as critical bandwidth. Critical bands are defined by the distances in frequency in which masking of tones occurs in human ear, roughly correspond to linear position on the cochlea. Thus, the present invention utilizes an equation that, using a single parameter, chosen by a user, generates a spectrum of threshold elevations that generally fall along a straight line when plotted on models using dBHL against Bark frequency where said threshold elevations can be used to adjust a sound signal for persons with hearing loss or persons who simply wish to enhance the audio signal to their preference.

In some embodiments, the term personalized sound adjustment model is used interchangeably with "a means for executing a personalized sound adjustment model". Said means may be computing the model on a microprocessor, a digital signal processor, or using code for executing the model on computer-readable media. In some embodiments, the term personalized sound adjustment model is used interchangeably with a "means for determining threshold elevations from ambient noise." Said means may be, for example, dividing an ambient noise signal into frequency components, estimating the ambient noise power of a frequency component, and determining threshold elevations corresponding to a frequency component.

32. Power Estimation Model/Block: estimating the power value of an audio signal. In some embodiments, the term Power Estimation Block/Model is used interchangeably with a "means for estimating a power value of an audio signal." Audio power estimation can be conducted using a variety of known techniques which would be understood by one skilled in the art. For example, some use a Minimum Statistics approach which is based on tracking minima of a short term power estimate of the audio signal in bands, over time. If a Fourier transform of the signal is used the power estimate is the square of the magnitude of the frequency component.

33. Psychoacoustic model: Any appropriate psychoacoustic models can be used by the present invention to compute gains needed to amplify sound to overcome the effects of ambient noise on sound perception or gains needed to account for preferred threshold elevations computed for users' of normal hearing. One example of a known psychoacoustic model is as follows:

$$\frac{\sqrt[\alpha]{P_{SIG}^\alpha + P_{NOISE}^\alpha - P_{THRQ}^\alpha}}{P_{SIG}}$$

where G is the gain ratio, $P_{SIG}$ is the signal intensity at a frequency in units of power, $P_{NOISE}$ is the signal intensity of the background noise, $P_{THRQ}$ is the absolute threshold of hearing, and $\alpha=0.2$ is a constant. In some embodiments, the term psychoacoustic model is used interchangeably with a "means for generating or computing corrective gains corresponding to predetermined threshold elevations". Said means may be, for example, additional known psychoacoustic models, perceptual models, computational models, and models utilizing parallel compression fit against known psychoacoustic models.

34. RF Transceiver: Radio Frequency Transmitter/Receiver—this device interfaces directly with the antenna and can modulate an audio signal with its radio carrier frequency for transmission as well as demodulate a received radio frequency signal 35. Source signal: The Source signal, as used herein refers to a portion of the first audio signal or the audio signal of interest at a given frequency component.

36. Speaker: The speaker can be any speaker or the like capable of receiving and projecting a sound signal adjusted or corrected by the present invention.
37. Storage media: A computer readable media used for storing data, such as a hard disk, RAM, or flash memory
38. Summer block: Summation occurs when two or more audio signals are combined together to create a new wave form. Summation is the combining of two audio signals at the same frequency—not to be confused with mixing, which involves the combining of audio signals at different frequencies. Electrical summation occurs inside an electrical circuit. In some embodiments, the term summer block is used interchangeably with a "means for combining an audio signal with another audio signal". Said means may be, for example, a summer.
39. Threshold elevation: Threshold elevations correlate to the minimum sound pressures required to perceive sounds at various frequencies.

BRIEF DESCRIPTION OF THE DRAWINGS

FIG. 1 is a drawing of a possible embodiment for the systems architecture of the present invention, where most processes are implemented on a microprocessor.

FIG. 2. Is a drawing illustrating an application of parallel compression to approximate a psychoacoustic non-linear compressor, where the parameters of the parallel compression are dynamically adjusted.

FIG. 3 is a drawing of an exemplary embodiment of the present invention, using a dynamically adjusted parallel compression to approximate the desired non-linear compression of the psychoacoustic model.

FIG. 4 is a plot of the compression ratio needed to make the parallel compression module approximate the psychoacoustic model, as found by fitting the parallel compression curves against the desired model curves.

FIG. 5 is a plot of the makeup gain needed to make the parallel compression module approximate the psychoacoustic model, as found by fitting the parallel compression curves against the desired model curves.

FIG. 6 is a drawing of a possible embodiment for the systems architecture of the present invention, where the Frequency Analysis Module is composed of a digital filter bank.

FIG. 7 is a drawing of a possible embodiment for the systems architecture of the present invention, where the Frequency Analysis Module is composed of a FFT co-processor.

FIG. 8 is a drawing of a possible process flow for the present invention.

FIG. 9 is a drawing of a possible process flow for the present invention using a parallel processing flow.

FIG. 10 is a drawing of a possible process flow for the present invention using parallel compression to approximate the psychoacoustic model.

DESCRIPTION OF PREFERRED EMBODIMENTS

Apparatus

In some embodiments, the present invention comprises an apparatus 100, effective in producing corrections to a source audio signal across a spectrum of frequencies by applying corrective gains of amplitude to a plurality of channels which constitute a source audio signal, wherein corrective gains are generated for each channel through a psychoacoustic model, where the psychoacoustic model takes as inputs the source signal X and the noise signal $X_0$, where the model computes the gain in sound intensity at a given frequency required to correct for the effect of an ambient noise signal, the apparatus 100 comprising:

(a) a first audio device 02, configured to extract a first audio signal 002 where the first audio signal 002 is a broadband audio signal of interest, the first audio device 02 operatively connected to a microprocessor 01;

(b) a second audio device 03, configured for extracting a second audio signal 003, where the second audio signal 003 is broadband ambient noise in the environment, the second audio device 03 operatively connected to the microprocessor 01;

(c) the microprocessor 01, configured to execute a plurality of applications for:
  i. a first frequency analysis module 04, configured to extract a plurality of frequency components from the first audio signal 002;
  ii. a second frequency analysis module 05, configured to extract a plurality of frequency components from the second audio signal 003;
  iii. a first power estimation block 06, configured to calculate the sound intensity in decibels of each of the frequency components of the first audio signal 002;
  iv. a second power estimation block 07, configured to calculate the sound intensity in decibels of each of the frequency components of the second audio signal 003;
  v. a psychoacoustic model 08, which takes as input the sound intensity of the first audio signal 002 as the signal of interest, and the sound intensity of the second audio signal 003 as a threshold elevation, and computes a correction gain for the first audio signal 002 for each frequency component of the first audio signal 002;
  vi. a Gain Block component 09, configured to apply the computed correction gains corresponding to each of the frequency components of the first audio signal 002;
  vii. a Frequency Synthesis Module 10, which combines the frequency components of the resulting audio signal to form an output signal where the output signal is the corrected version of the original first audio signal 002;

whereupon (i) the first audio device 02 extracts the first audio signal 002, where the first audio signal 002 is transmitted to the microprocessor 01, which converts the first audio signal 002 into digital format;

and simultaneously, (ii) the second audio device 03 extracts the second audio signal 003, where said second audio signal 003 is then transmitted to the microprocessor 01, which converts the second audio signal 003 into digital format;

whereupon the first audio signal $x(t)$ 002 and the second audio signal $x_0(t)$ 003 are fed, respectively, through the First Frequency Analysis Module 04 and Second Frequency Analysis Module 05 breaking down each respective audio signal into arrays of frequency components;

whereupon the first audio signal 002 and the second audio signal 003 are fed, respectively, through the first Power Estimation Block 06 and the Second Power Estimation Block 07, resulting in power estimates for the sound intensities of each of the frequency components corresponding to both the first audio signal 002 and the second audio signal 003, in decibels;

whereupon the microprocessor 01 applies the source signal power estimates and the noise signal power estimates, to the psychoacoustic model 08 in order to obtain gains represented by $\Delta \overline{X}$ in dB, for each frequency component;

whereupon the microprocessor 01 amplifies each frequency component of the source signal by the corresponding gain computed, by feeding the frequency component through the gain block 09;

whereupon the microprocessor 01 reconstitutes the first audio device signal 002 into a corresponding output audio signal by feeding the various frequency components of the source signal 002 through the Frequency Synthesis Module 10, obtaining output $x_{out}(t)$.

The apparatus described above may be combined with a number of possible psychoacoustic models, derived from the audiology literature, which are used to compute the gain needed to amplify sound to overcome the effects of ambient noise on sound perception. The gains may be computed over the entire spectrum or by dividing the spectrum up into any number of smaller bandwidth or frequency components.

An example of a psychoacoustic model which may be combined with the present invention may be found in works such as CA model for the prediction of thresholds, loudness and partial loudness' Moore and Glasberg, Journal of the Audio Engineering Society, 1997) and ('Relationship Between Measures Related to the Cochlear Active Mechanism and Speech Reception Thresholds in backgrounds with and without Spectral and/or Temporal Fluctuations' Rosenberg, 2004, PhD Thesis MIT). These models define a mathematical relationship between the sound impinging on the ear and the apparent loudness of the sound as perceived by a human.

The models above may be used to derive a formula for the gain needed to amplify sound to overcome interfering noise, the formula may be written:

$$\frac{\sqrt[\alpha]{P_{SIG}^\alpha + P_{NOISE}^\alpha - P_{THRQ}^\alpha}}{P_{SIG}}$$

where G is the gain ratio, PSIG is the signal intensity at a frequency in units of power, PNOISE is the signal intensity of the background noise, PTHRQ is the absolute threshold of hearing, and $\alpha=0.2$ is a constant.

The invention is not intended to be limited to the psychoacoustic model just described. Any psychoacoustic model capable of generating gains needed to compensate for noise may be used in combination with the present invention.

As shown in FIG. 2, in some embodiments, an alternative means of effectuating the gains demanded by the psychoacoustic model is to harness an existing sound processing technique known as parallel compression. Parallel compression involves compressing a copy of an original signal using linear compression 112, and subsequently adding this compressed signal back into the original signal 110. This results in a non-linear compression curve that amplifies low sounds below a certain threshold. The shape of the compression curve is controlled by a number of parameters including the threshold (T), compression ratio (R), and makeup gain (M). By varying these parameters, the parallel compression curves can be made to approximate the compression curve that would otherwise be produced by applying the psychoacoustic model. This is done by fitting the parameters against the desired characteristics of the psychoacoustic model using a least-squares error fit. These parameters are then stored in memory in a lookup table 111, or computed using a formula and may be retrieved in real time to dynamically update the parallel compression block 112. Since the psychoacoustic model, in some embodiments, depends upon both the signal and noise power, both signal and noise power 106, 107 can factor into determining the gains. Thus, these parameters can be updated at each time step to account for changing noise. Typically the T parameter is chosen to be the threshold elevation (or noise power) minus 20 dB. From that point, the makeup gain and compression ratio are found using standard curves that have been derived by fitting those curves against the psychoacoustic model. Plots of the parameters used for varying threshold elevations are shown in FIG. 4 and FIG. 5. Here we can see that the desired compression ratio has an "upside down U" shape for varying threshold elevations.

As shown in FIG. 3, a possible embodiment of the present invention using the parallel compression method is shown. As shown in FIG. 3, the apparatus 200 comprises:

(a) a first audio device 202, configured to extract the first audio signal where the first audio signal is a broadband audio signal of interest, the first audio device operatively connected to a microprocessor 201;

(b) a second audio device 203, configured for extracting ambient broadband audio in the environment, the second audio device operatively connected to the microprocessor 201;

(c) the microprocessor 201, operatively connected to the first audio device 202, the second audio device 203, where in some embodiments, the microprocessor 201 is configured to execute applications for:

i. a first frequency analysis module 204, configured to extract a plurality of frequency components from the first audio signal;

ii. a second frequency analysis module 205, configured to extract a plurality of frequency components from the second audio signal;

iii. a first power estimation block 206, configured to calculate the sound intensity in decibels of each frequency component of the first audio signal;

iv. a second power estimation block 207, configured to calculate the sound intensity of decibels of each frequency component of the second audio signal;

v. a parallel compression block, the parallel compression block comprising:

a. a parameter estimation module 211, containing parameter settings for the parallel compression module, including threshold, compression ratio and makeup gain, and a b. a parallel compression module 209, capable of adjusting threshold, compression ratio, and makeup gain parameters in real time, vi. a Frequency Synthesis Module 210, which combines the frequency components of the resulting audio signal.

whereupon (i) the first audio device 202 extracts the first audio signal, where the first audio signal is then transmitted through an analog to digital converter, thereby converting the first audio signal into digital format;

and simultaneously, (ii) the second audio device 203 extracts a second audio signal, where said second audio signal is then transmitted through a second analog to digital converter thereby converting the second audio signal into digital format;

whereupon the first audio signal x(t) and the second audio signal $x_0(t)$ are fed, respectively, through the First Frequency Analysis Module 204 and Second Frequency Analysis Module 205 breaking down each respective audio signal into arrays of frequency components;

whereupon, for each frequency component, the first audio signal and the second audio signal are fed, respectively, through the first Power Estimation Block 206 and Second Power Estimation Block 207, resulting in estimates for the sound intensity of each signal in decibels;

whereupon, for each frequency component, the microprocessor 201, using the power estimate of the frequency component of the first and second audio signals, obtains parameters from the parameter estimation module 211, whereupon the microprocessor 201, applies these gains to a parallel compression module, whereupon the parallel compression module 209 applies a linear compression, according to the given parameters, to the frequency component of the first audio signal, whereupon the parallel compression module 209 sums each frequency component of the first audio signal with the resulting parallel compressed audio signal, whereupon the microprocessor 201 repeats the process of estimating the power, selecting compression settings, and applying parallel compression for each frequency component of the first audio signal, whereupon the microprocessor 201 reconstitutes the output audio signal by feeding the various components of the first audio signal through the Frequency Synthesis Module 210, obtaining output $x_{out}(t)$.

As shown in FIG. 6, the present invention can be implemented using a variety of different methods to decompose the signal into frequency components. A possible embodiment of the present invention can be an apparatus, and can comprise an audio device, a microphone for reception of the ambient noise, an amplifier, a speaker and a microprocessor where a number of software applications are executed by a microprocessor. The apparatus 300 comprises:
- (a) a first audio device 302, configured to extract the first audio signal where the first audio signal is a broadband audio signal of interest, the first audio device operatively connected to a microprocessor 301;
- (b) a second audio device 303, configured for extracting ambient broadband audio in the environment, the second audio device operatively connected to the microprocessor 301;
- (c) the microprocessor 301, operatively connected to the first audio device and 302, the second audio device 303, the microprocessor 301: configured to execute applications for:
    - i. a first digital filter bank 304;
    - ii. a second digital filter bank 305;
    - iii. a first power estimation block 306;
    - iv. a second power estimation block 307;
    - v. a psychoaccoustic model component 308;
    - vi. a Gain Block component 309;
    - vii. a Summer Block 310.

A possible process flow for the present invention can comprise the following steps:
1. the first audio device 302 extracts the first audio signal, where the first audio signal is then transmitted to the microprocessor 301 through an analog to digital converter, thereby converting the first audio signal into digital format;
2. and simultaneously, the second audio device 303 extracts a second audio signal, where said second audio signal is then transmitted to the microprocessor 302 through a second analog to digital converter thereby converting the second audio signal into digital format;
3. whereupon the first audio signal x(t) and the second audio signal $x_0(t)$ are fed, respectively, through the First Digital Filter Bank 304 and Second Digital Filter Bank 305 breaking down each respective audio signal into into separate channels $\bar{x}(t)$ and $\bar{x}_0(t)$ corresponding to varying frequencies;
4. whereupon the microprocessor 301 applies the source signal and the noise signal, now in dB, to the psychoacoustic model component 308 in order to obtain, $\Delta\bar{X}$ in dB, for each band, wherein the power estimate of the second audio signal stands in for the threshold elevation input to the hearing loss model;
5. whereupon the microprocessor 301 amplifies each channel of the source signal by feeding the bands through the corresponding gains 309 to obtain $\bar{x}_{out}(t)$;
6. whereupon the microprocessor 301 reconstitutes the first audio signal by feeding the various bands of the source signal through the Summer Block 310, obtaining output $x_{out}(t)$;

As shown in FIG. 7, in some embodiments, the present invention may also use an explicit Fourier transform of the signal to compute the gains instead of a band of channels. In this case the embodiment comprises an apparatus 400, effective in producing corrections to a source audio signal across a spectrum of frequencies by applying corrective gains of amplitude to a Fourier transform of the source audio signal, wherein corrective gains are generated for each channel through a psychoacoustic model, where the psychoacoustic model takes as inputs the source signal intensity X and the noise signal intensity $X_0$, where the model computes the gain in sound intensity at a given frequency required to correct for the effect of an ambient noise signal, the apparatus 400 comprising:
- (a) a first audio device 402, configured to extract the first audio signal where the first audio signal is a broadband audio signal of interest, the first audio device operatively connected to a microprocessor 401;
- (b) a second audio device 403, configured for extracting ambient broadband audio in the environment, the second audio device operatively connected to the microprocessor 401;
- (c) the microprocessor 401, operatively connected to the first audio device 402 and the second audio device 403, the microprocessor 401 configured to execute applications for:
    - i. an FFT co-processor 411;
    - ii. a psychoacoustic model component 406;
    - iii. a Gain Block component 407;
    - iv. a Frequency Synthesis Module 413;

A possible process flow for this embodiment comprises the following steps:
1. the first audio device 402 extracts the first audio signal, where the first audio signal is then transmitted through an analog to digital converter, thereby converting the first audio signal into digital format;
2. and simultaneously, (ii) the second audio device 403 extracts a second audio signal, where said second audio signal is then transmitted through a second analog to digital converter thereby converting the second audio signal into digital format;
3. whereupon the first audio signal x(t) and the second audio signal $x_0(t)$ are fed, respectively, through the FFT co-processor 411 breaking down each respective audio signal into into separate components X(f) and $X_0(f)$ corresponding to varying frequencies;
4. whereupon the microprocessor computes a power value for each component of the FFT of the First and Second audio signals 406, 407;
5. whereupon the microprocessor 401 applies the power of the source signal and the noise signal, now in dB, to the psychoacoustic model component 408 in order to obtain, ΔX(f), in dB, for each band, wherein the power of the second audio signal is used as a threshold elevation estimate;

6. whereupon the microprocessor 401 amplifies each spectral component of the source signal by feeding the bands through the gain block 409 to obtain $X_{out}(f)$;
7. whereupon the microprocessor 401 reconstitutes the first audio signal by feeding the various bands of the source signal through the Frequency Synthesis Module 410, obtaining output $x_{out}(t)$;

As shown in FIG. 2, in a preferred embodiment of the present invention, parallel compression is used to approximate the non-linear compression curve produced by the psychoacoustic model. This is performed by dynamically varying the settings of the parallel compression system, including the threshold (T), compression ratio (R) and the makeup gain (M). By fitting against the psychoacoustic model using a least squared error fit, these settings can be chosen to approximate the desired compression curve. Subsequently, for each subband or frequency component, and at each instant in time, the settings can be varied dynamically.

In some embodiments, some elements of the above process flow might be performed using analog circuitry before being input to the microprocessor. For instance, op-amps can be used to apply gain to separate channels, and analog filters can be used to produce separate analog channels of the signal.

Analog-to-digital and digital-to-analog converters are assumed to exist at interface points between analog elements and digital elements of any embodiment.

In another possible hardware embodiment, a parallel processing architecture may be used where the various channels of the signal are processed simultaneously using multiple processors before being reconstituted.

In some embodiments, referring to the means of extracting amplitudes of source signals or ambient noise signals: at the output of each filter which selects a band of adjacent frequencies, the present invention further comprises an electrical circuit to effect extraction of amplitudes which could be the use of a diode, or rectifier bridge, fed by each signal which, in turn, feeds a simple series resistor and a capacitor in shunt to create an integrator of the absolute value of the signal. The integrator would accumulate rectified current for some period of time before being applied to the loudness response curve selection circuit, after which the capacitor would be shorted to discharge the accumulated current, in anticipation of the next cycle of integration. Alternatively, the capacitor could be allowed to discharge continuously through a higher valued resistor in shunt, so that charge can be bled off more slowly than it is accumulated, thereby forming a running exponential average integrator.

A more sophisticated version of amplitude estimation could send the signals through a squarer circuit ahead of the RC integrator in order to accumulate an estimate of the power in the signal. The resulting integrated current would be an estimate of the RMS power at the end of the integration period. This power estimate could then feed a gain correction curve selection circuit.

The output of each integrator can be fed to an analog differencing amplifier (operational amplifier, or OpAmp) to subtract the estimated amplitude of the noise signal from the estimated amplitude of the signal of interest. The output of this difference amplifier can be used to establish a dynamic compressor threshold. The output of the compressor circuit (a voltage controlled amplifier, or VCA) can be added to the dry signal to effect a nonlinear correction. A simple linear compressor (VCA) adjusted with suitable make-up gain and compression ratio can produce, in sum with the dry signal, an approximation of the required nonlinear correction gain.

The present invention is not limited to the aforementioned examples of means of extracting amplitudes.

In some embodiments, programmable logic devices, including but not limited to FPGAs, may be used to implement parts of the processing shown in FIGS. 1, and 2, with appropriate interfaces implemented between the microprocessor and the programmable logic devices.

Computer Readable Media

In some embodiments, as explained by FIG. 8 and its description, the present invention can be enabled on a computer-readable medium 570 storing a set of instructions executable by one or more processors, where the computer-readable medium 570 is effective in producing proper corrections to an audio signal across a plurality of channels by applying corrective gains of amplitude to the channels of the signal which constitutes a first audio signal, wherein corrective gains are generated for each channel through an arbitrary psychoacoustic model, where the model computes the gain in sound intensity at a given frequency based on the composition of the ambient noise signal, the computer-readable medium comprising code for:

a. extracting the first audio signal x(t) 502, said first audio signal comprising a plurality of channels corresponding to varying frequencies,
b. extracting a second audio signal $x_0(t)$ 503, said second audio signal comprising a plurality of channels corresponding to varying frequencies,
c. feeding the first audio signal through a first Frequency Analysis Module 504 where the first audio signal is broken down into separate frequency components corresponding to varying frequencies;
d. feeding the second audio signal through a second Frequency Analysis Module 505 where the second audio signal is broken down into separate frequency components corresponding to varying frequencies;
e. identifying the source component 555, wherein the source component is a particular frequency component of the first audio signal;
f. identifying a corresponding noise frequency component at the same frequency as the source component 556, wherein the noise band is a particular component of the second audio signal;
g. computing the power value of the source component 506;
h. computing the power value of the noise component 507;
i. code for using the power value of the source and the power value of the noise components to solve for gain $\Delta X_i$ using the psychoacoustic model 508, where the power value of the noise component represents the threshold elevation or estimated hearing loss;
j. applying a corrective gain 509 to the first audio signal;
k. feeding the first audio signal through a Frequency Synthesis Module 510 producing a corrected audio signal $x_{out}(t)$.

In some embodiments, steps for converting analog audio input signals to digital input signals can be bypassed where the invention utilizes digital input audio devices capable of receiving digital audio signals and transmitting the same to the processor.

In varying embodiments, as shown in FIGS. 8 and 9, the present invention may be implemented either in parallel or in series, or with some parts of the process implemented in parallel and others implemented in series.

As shown in FIG. 9, a possible embodiment of the processing chain may be implemented in parallel, such as via a multi-threaded process or the use of a parallel processing device.

As shown in FIG. 10, an alternative embodiment of the present invention may involve a computer-readable medium 770 storing a set of instructions executable by one or more processors, where the computer-readable medium 770 is effective in producing proper corrections to an audio signal across a plurality of channels by applying parallel compression to the channel, where the parameters controlling the parallel compression are dynamically varied in order to approximate a desired compression curve,
the computer-readable medium comprising:
  a. code for extracting the first audio signal x(t) 702, said first audio signal comprising a plurality of channels corresponding to varying frequencies,
  b. extracting a second audio signal $x_0(t)$ 703, said second audio signal comprising a plurality of channels corresponding to varying frequencies,
  c. feeding the first audio signal through a first Frequency Analysis Module 704 where the first audio signal is broken down into separate components corresponding to varying frequencies;
  d. feeding the second audio signal through a second Frequency Analysis Module 705 where the second audio signal is broken down into separate components corresponding to varying frequencies;
  e. identifying the source component, wherein the source band is a particular component of the first audio signal 750;
  f. identifying the noise band, wherein the noise band is a particular component of the second audio signal 750;
  g. computing the power value of the source component 706;
  h. computing the power value of the noise component 707;
  i. code for using the power value of the source and the power value of the noise signal to select parameters for a parallel compression module 708;
  j. code for compressing the first audio signal using parallel compression according to the parameter settings selected 709;
  k. code for feeding the resulting audio signal through a Frequency Synthesis Module 710 producing the corrected audio signal $x_{out}(t)$;
  l. code for repeating the above steps for a plurality of frequency components and for every time step;

In some embodiments, discrete sets of parameters for the parallel compression are found by dividing the range of possible noise volumes into discrete levels, where sets of parameters are found for each discrete noise loudness level, where the parameter estimation module 422 is a lookup table, where during real-time processing the ambient noise intensity is measured and used to select the corresponding set of parameters.

In some embodiments, the parameter estimation module 422 is a polynomial continuous curve defining the relationship between the ambient noise loudness and each of the parameters, where polynomial regression is used to find parameters which define this curve, where these parameters are then stored in memory, so that during processing the parameters can then be computed using a polynomial equation.

In some embodiments, one or more parameters (e.g. T) is defined as a function of the ambient noise intensity (e.g. $T=P_N-T'$, where $P_N$ is noise loudness), such that the parameters stored (e.g. T') are the parameters of the function defining the relationship between sound intensity (e.g. $P_N$) and the parameter (e.g. T) of the parallel compression.

In some embodiments, the gain equation is expressed as a function of the difference between signal intensity and noise intensity:

$$G=g0+(dP-T')/R-dP$$

where dP is the difference between the signal loudness and noise loudness in decibels, and T' is the threshold offset from the ambient noise intensity to the threshold T.

In this embodiment, a fixed set of parameters is used. The fixed parameters may fall in the range of 2 to 6 for compression ratio, 15 dB to 25 dB for makeup gain, and −15 to −25 dB for threshold offset.

In some embodiments, the First and Second Frequency Analysis Modules 406, 407 are composed of digital filter banks which are filters that break the signal down into various sub-band channels $\bar{x}(t)$ and $\bar{x}_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module 418 is a summer operation that combines the various channels into output xout(t).

In some embodiments, the First and second Frequency Analysis Modules 406,407 are digital filter banks composed of wavelet filters.

In some embodiments, the various sub-band channels correspond to critical bands of hearing.

In some embodiments, the First and Second Frequency Analysis Modules 406,407 are composed of FFT coprocessors that perform Fourier transforms on the input signals producing X(t) and X0(t), where the power of each component is found by squaring the Fourier component, and the Frequency Synthesis Module 418 is an FFT coprocessor that performs an inverse Fourier transform, resulting in output signal xout(t).

In some embodiments, the frequency components may be grouped together to approximate sub-bands correspond to critical bands of hearing.

The present invention features systems for audio correction. The systems may include but are not limited to mobile phones (and the like) and music players (and the like).

The present invention features an apparatus for correcting an audio signal. The apparatus, or audio device as claimed, (e.g., a mobile phone) may, for example, comprise a standard mobile phone receiver, a standard mobile phone microphone, and a standard mobile phone speaker, all of which are well known to one of ordinary skill in the art. The receiver can function to extract an amplitude of a source signal (e.g., an incoming conversation on a mobile phone) at given frequency (or within a frequency range) and the microphone can function to detect an amplitude of a ambient noise signal in the user's environment at a corresponding frequency (or within a frequency range).

In some embodiments, the systems of the present invention can evaluate sounds within pre-determined ranges of frequencies, e.g., any appropriate set or group of ranges. Microphones, and/or receivers and/or the like can collect information for the particular frequency range (the pre-determined frequency range). In some embodiments, a first range is 500 Hz and below, a second range is between 500 Hz and 2 kHz, and a third range is above 2 kHz. In some embodiments a first range is 1 kHz and below and a second range is above 1 kHz. The present invention is not limited to the aforementioned ranges.

Without wishing to limit the present invention to any theory or mechanism, it is believed that the present invention is advantageous because the present invention features a maximum output volume, for example the source signal will be amplified to only a certain degree. This can help protect against damage to the user's hearing. Furthermore, the systems frequently detect the ambient noise (e.g., 10-40 times per second, 1,000 times per second, etc.), allowing for the systems to react quickly to changes in the ambient noise. Furthermore, the systems utilize non-linear corrections, thus, loud signals are not amplified much if at all.

The systems of the present invention can allow for microphone sensitivity to be altered. For example, a particular user may wish to have more correction or less correction. For example, the microphone may be in someone's pocket, or else exposed directly to the ambient noise sounds. If the microphone becomes shielded, it will produce a weaker response to the noise than if it were directly exposed. Hence the microphone gain can be increased to compensate for the shielding. Also, each of us has a slightly different response to noise levels, some people being more sensitive to it than others. A variable gain on the microphone can help to compensate for individual differences of loudness perception. Finally microphones exhibit varying characteristics depending on their specific construction. A variable microphone gain in the software can help to normalize the response from different microphones.

The systems of the present invention can allow for signals to be corrected prior to transmission or recording, such that ambient noise in the recorded or received signal is retained, but the spectral composition of the primary source signal is modified to compensate, as an alternative to standard noise reduction techniques.

In some embodiments, steps for converting analog audio input signals to digital input signals can be bypassed where the invention utilizes digital input audio devices capable of receiving digital audio signals and transmitting the same to the processor.

In some embodiments the present invention may be accessed via a web application or interface, where this web application resides on a web page, an electronic device such as a mobile phone, or any other general computing device.

The present invention features an apparatus for enhancing an audio signal. The apparatus, or audio device as claimed, (e.g., a mobile phone) may, for example, comprise a standard mobile phone receiver, a standard mobile phone microphone, and a standard mobile phone speaker, all of which are well known to one of ordinary skill in the art. The receiver can function to extract an amplitude of a source signal at a given frequency (or within a frequency range).

In some embodiments, the systems of the present invention can evaluate sounds within pre-determined ranges of frequencies, e.g., any appropriate set or group of ranges. Microphones, and/or receivers and/or the like can collect information for the particular frequency range (the pre-determined frequency range). In some embodiments, a first range is 500 Hz and below, a second range is between 500 Hz and 2 kHz, and a third range is above 2 kHz. In some embodiments a first range is 1 kHz and below and a second range is above 1 kHz. The present invention is not limited to the aforementioned ranges.

As used herein, the term "hearing impaired" refers to physical hearing impairment, as in the traditional sense of hearing loss, and/or, can also refer to temporary hearing loss caused by a ambient noise or other temporary hearing loss factors. One of the novel discoveries addressed by the present invention is that a individual with normal hearing can in fact experience hearing impairment due to ambient noise, or ambient signals interfering with source noise or source signals.

Additional Disclosures of Preferred Embodiments

In some broad embodiments, the present invention comprises an apparatus 200, effective in producing corrections to a source audio signal, across a spectrum of frequencies, by applying corrective gains of amplitude to a plurality of channels which constitute the source audio signal, wherein parallel compression is used to approximate gain curves derived from a psychoacoustic model. The parallel compression is implemented by applying a gain G to the signal of interest according to linear compression, and then combining the compressed signal with the source audio signal, such that the combined parallel compression of the source signal forms a non-linear compression curve, where the linear compression is found by the equation, $$G = g0 + (P-T)*(1/R-1),$$

where G is the gain in dB to be applied to the signal, where g0 is the makeup gain in dB, T is the threshold in dB, and R is the compression ratio, and where P is the sound intensity in dB of the source audio signal in a channel, such that g0, T, and R are parameters that vary the shape of the resulting parallel compression curve. The psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness levels, are predetermined by fitting the parallel compression curves against the desired behavior, where a different set of parameters is retrieved at each instant depending on the ambient noise volume in each frequency, where the dynamically changing noise loudness results in a dynamically changing selection of parameters for the parallel compression module.

In some embodiments, the apparatus 200 comprises a first audio device 202, configured to extract a first audio signal 002 where the first audio signal is a broadband audio signal of interest. In some embodiments, the first audio device is operatively connected to a microprocessor 201.

In some embodiments, the apparatus 200 comprises a second audio device 203, configured for extracting a second audio signal 003 where the second audio signal 003 is ambient broadband audio in the environment, the second audio device 203 operatively connected to the microprocessor 201.

In some embodiments, the apparatus 200 comprises the microprocessor 201, operatively connected to the first audio device 202 and the second audio device 203. The microprocessor 201 can be configured to execute a variety of applications, including, but not limited to applications for a first frequency analysis module 204, configured to extract a plurality of frequency components from the first audio signal 002.

In some embodiments, the microprocessor 201 can be configured to execute a variety of applications, including, but not limited to applications for a second frequency analysis module 205, configured to extract a plurality of frequency components from the second audio signal 003.

In some embodiments, the microprocessor 201 can be configured to execute a variety of applications, including, but not limited to applications for a first power estimation block 206, configured to calculate the sound intensity in decibels of each frequency component of the first audio signal 002.

In some embodiments, the microprocessor 201 can be configured to execute a variety of applications, including, but not limited to applications for a second power estimation block 207, configured to calculate the sound intensity of decibels of each frequency component of the second audio signal 003.

In some embodiments, the microprocessor 201 can be configured to execute a variety of applications, including, but not limited to applications for a parameter estimation module 211, which determines parameter settings for a parallel compression module, according to information stored in memory. This module can, in some embodiments, using the psychoacoustic model, determine parameter settings for the parallel compression module 209 that correspond to threshold elevations computed from the power of the interfering ambient noise.

In some embodiments, the microprocessor 201 can be configured to execute a variety of applications, including, but not limited to applications for the parallel compression module 209, parameterized by a threshold T, a compression ratio R, and a makeup gain g0, where said parameters may by dynamically varied, where the parallel compression module is comprised of a linear compression module 112, which, using the parameters applies gains to the first audio signal according to the equation $$G = g0 + (P-T)*(1/R+1),$$

where G is the gain in dB to be applied to a frequency component of the first audio signal, P is the sound intensity of the frequency component in dB, g0 is the makeup gain in dB, T is the threshold in dB, and R is the compression ratio of the linear compression, and a summer 110, which combines the resulting amplified first audio signal component with the original first audio signal component.

In some embodiments, the microprocessor 201 can be configured to execute a variety of applications, including, but not limited to applications for a Frequency Synthesis Module 210, which combines the frequency components of the resulting audio signal.

In some embodiments, the apparatus 200 functions according to the following steps:
  (i) the first audio device 202 extracts the first audio signal 002, whereupon the first audio signal 002 is then transmitted through an analog to digital converter, thereby converting the first audio signal 002 into digital format, and simultaneously, (ii) the second audio device 203 extracts a second audio signal 003, where said second audio signal 003 is then transmitted through a second analog to digital converter thereby converting the second audio signal 003 into digital format,
  whereupon the first audio signal x(t) 002 and the second audio signal $x_0(t)$ 003 are fed, respectively, through the First Frequency Analysis Module 204 and Second Frequency Analysis Module 205 breaking down each respective audio signal into arrays of frequency components,
  whereupon, for each frequency component, the first audio signal 002 and the second audio signal 003 are fed, respectively, through the first Power Estimation Block 206 and Second Power Estimation Block 207, resulting in estimates, for each frequency component, and at each instant, for the sound intensity of each signal in decibels;
  whereupon, for each frequency component, and at each instant, the microprocessor 201, using the power estimates of the frequency components of the first 002 and second 003 audio signals, obtains parameters for the parallel compression 211, depending on the sound intensity of the second audio signal at each instant,
  whereupon the microprocessor 201, applies the parameters to a parallel compression module 209,
  whereupon the parallel compression module 209 applies a linear compression, according to the selected parameters, to each of the frequency components of the first audio signal 002,
  whereupon the parallel compression module 209 sums each frequency component of the first audio signal 002 with the corresponding compressed audio signal,
  whereupon the microprocessor 201 repeats the process of estimating the power of both the signal of interest and the noise, selecting compression settings, and applying parallel compression for each frequency component of the first audio signal 002,
  whereupon the microprocessor 201 reconstitutes the first audio signal 002 by feeding the now parallel compressed frequency components of the parallel compressed audio signal 002 through the Frequency Synthesis Module 210, thereby obtaining an output $x_{out}(t)$.

In some embodiments, the present invention the First 204 and Second 205 Frequency Analysis Modules are composed of a digital filter banks 304, 305 of filters and output and the frequency components comprise time-domain arrays of band-limited frequency channels for the first 002 and second 003 audio signals, and where the Frequency Synthesis Module is a summer block that summers together the channels of the audio signals after gains have been applied.

In some embodiments, the frequency sub-bands correspond to critical bands of hearing.

In some embodiments, the First and second Frequency Analysis Modules are digital filter banks composed of wavelet filters.

In some embodiments, the First 204 and Second 205 Frequency Analysis modules are composed of FFT co-processors 411 and the frequency components comprise output Fourier transform components for the first 002 and second 003 audio signals, and where the Frequency Synthesis Module 210 is an IFFT co-processor 410.

In some embodiments, the frequency components are grouped together to approximate sub-bands correspond to critical bands of hearing.

In some embodiments, the plurality of desired dynamic range compression curves approximate the ideal compression curves needed to compensate for a plurality of ambient noise signal intensities, so that the derived parallel compression parameters correspond to a plurality of ambient noise loudness levels.

In some embodiments, discrete sets of parameters are found by dividing the range of possible noise volumes into discrete levels, and where sets of parameters are found for each discrete noise loudness level, where the parameter estimation module 211 is a lookup table, where during real-time processing the ambient noise intensity is measured and used to select the corresponding set of parameters.

In some embodiments, the parameter estimation module 211 is a polynomial continuous curve defining the relationship between the ambient noise loudness and each of the parameters, where polynomial regression is used to find parameters which define this curve, where these parameters are then stored in memory, so that during processing the parameters can then be computed using a polynomial equation.

In some embodiments, one or more parameters (e.g. T) is defined as a function of the ambient noise intensity (e.g. $T = P_N - T'$, where $P_N$ is noise loudness), such that the parameters stored (e.g. T') are the parameters of the function defining the relationship between sound intensity (e.g. $P_N$) and the parameter (e.g. T) of the parallel compression.

In some embodiments, the gain equation is expressed as a function of the difference between signal intensity and noise intensity:

$$G=g0+(dP-T')/R-dP$$

where dP is the difference between the signal loudness and noise loudness in decibels, and T' is the threshold offset from the ambient noise intensity to the threshold T.

In some embodiments, a fixed set of parameters is used.

In some embodiments, the fixed parameters fall in the range of 2 to 6 for compression ratio, 15 dB to 25 dB for makeup gain, and −15 to −25 dB for threshold offset. In some embodiments, the fixed parameters fall in the range of 1 to 2 for compression ratio. In some embodiments, the fixed parameters fall in the range of 6 to 10 for compression ratio. In some embodiments, the fixed parameters fall in the range of 10 to 20 for compression ratio. In some embodiments, the fixed parameters fall in the range of 0 dB to 5 dB for makeup gain. In some embodiments, the fixed parameters fall in the range of 5 dB to 10 dB for makeup gain. In some embodiments, the fixed parameters fall in the range of 10 dB to 15 dB for makeup gain. In some embodiments, the fixed parameters fall in the range of 25 dB to 35 dB for makeup gain. In some embodiments, the fixed parameters fall in the range of −30 to −25 dB for threshold offset. In some embodiments, the fixed parameters fall in the range of −25 to −15 dB for threshold offset. In some embodiments, the fixed parameters fall in the range of −15 to −5 dB for threshold offset.

In some embodiments, the apparatus is a mobile phone, music player, or headset.

In some embodiments, the processing of all frequency components of both signals are computed in parallel using multiple processing units, such as on a parallel processing device.

In some embodiments, the psychoacoustic model comprises a formula which computes the gain as a function of the signal and ambient noise levels which is needed to make the sound appear as loud as if the noise was not present, this formula comprising:

$$G = \frac{\sqrt[\alpha]{P_{SIG}^\alpha + P_{NOISE}^\alpha - P_{THRQ}^\alpha}}{P_{SIG}}$$

where G is the gain ratio, $P_{SIG}$ is the signal intensity at a frequency in units of power, $P_{NOISE}$ is the signal intensity of the background noise, $P_{THRQ}$ is the absolute threshold of hearing, and $\alpha=0.2$ is a constant.

In some embodiments, the present invention comprises a method of using parallel compression to approximate a desired non-linear dynamic range compression curve, wherein a compression curve defines the output loudness in decibels versus the input loudness in decibels of a signal of interest, wherein the compression is implemented by applying a gain G to the signal of interest according to the following equation:

$$G=g0+(P-T)*(1/R-1)$$

where G is the gain in dB to be applied to a frequency component of the first audio signal, P is the sound intensity of the frequency component in dB, g0 is the makeup gain in dB, T is the threshold in dB, and R is the compression ratio of the linear compression, whereupon the linearly compressed signal is added together with the original signal, producing a parallel compressed output signal, where the overall amplitude of the input versus the output signal defines a parallel compression curve, where g0, T, and R are thus parameters that vary the shape of the parallel compression curve, and P is the input loudness of the signal of interest, where the method is comprised of the following steps:
a. obtaining parameters that shape the parallel compression curve, by fitting compression curves using these parameters against a plurality of desired compression curves and selecting the parameters that minimize the difference between the compression curve of the parallel compression module and each of the desired compression curves;
b. storing the optimal sets of parameters in a memory device;
c. during real-time processing, at each time step:
1. retrieving a set of parameters, depending on the desired compression curve to be used,
2. applying the set of parameters, to the parallel compression module; and processing a first audio signal using the time-varying compression parameters in the parallel compression module, where the parallel compression module is performed by:
a. applying linear compression to the first audio signal according to the equation G=g0+(P−T)*(1/R+1), producing a linearly compressed, and
b. summing the linearly compressed audio signal with the first audio signal.

In some embodiments, the plurality of desired dynamic range compression curves approximate the ideal compression curves needed to compensate for a plurality of ambient noise signal intensities, so that the derived parallel compression parameters correspond to a plurality of ambient noise loudness levels.

In some embodiments, discrete sets of parameters are found by dividing the range of possible noise volumes into discrete levels, and where sets of parameters are found for each discrete noise loudness level, where the sets of parallel compression parameters are stored in a lookup table, and where during real-time processing the ambient noise intensity is measured and used to select the corresponding set of parameters.

In some embodiments polynomial regression is used to fit a continuous curve between the ambient noise loudness and each of the parameters, where the parameters of this curve are stored, and where during real time processing the ambient noise loudness is measured and applied to the polynomial function to obtain each parameter T, R, and g0.

In some embodiments one or more parameters (e.g. T) is defined as a function of the ambient noise intensity (e.g. T=$P_N$−T', where $P_N$ is noise loudness), such that the parameters stored (e.g. T') are the parameters of the function defining the relationship between sound intensity (e.g. $P_N$) and the parameter (e.g. T) of the parallel compression.

In some embodiments the gain equation is expressed as a function of the difference between signal intensity and noise intensity:

$$G=g0+(dP-T')/R-dP$$

where dP is the difference between the signal loudness and noise loudness in decibels, and T' is the threshold offset from the ambient noise intensity to the threshold T.

In some embodiments a fixed set of parameters is used.

In some embodiments the signal is divided into a plurality of sub-bands and parallel compression is applied independently to each channel.

In some embodiments, the present invention comprises a computer-readable medium 770 storing a set of instructions executable by one or more processors, where the computer-readable medium 770 is effective in producing corrections to a source audio signal, to compensate for the presence of an ambient noise signal, across a plurality of channels by applying corrective gains of amplitude to the channels which constitute the source audio signal, wherein parallel compression is used to approximate gain curves derived from a psychoacoustic model, wherein the compression is implemented by applying a gain G to the signal of interest according to the following equation:

$$G=g0+(P-T)*(1/R-1)$$

where G is the gain in dB to be applied to a frequency component of the source signal, P is the sound intensity of the frequency component in dB, g0 is the makeup gain in dB, T is the threshold in dB, and R is the compression ratio of the linear compression.

In some embodiments, the linearly compressed signal is added to the original signal, where the overall amplitude of the input versus the output signal defines a parallel compression curve, where g0, T, and R are thus parameters that vary the shape of the resulting compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness level, are determined beforehand and stored in memory, where a different set of parameters is retrieved at each instant depending on the ambient noise signal intensity in each frequency and where the dynamically changing noise signal intensity results in a dynamically changing selection of parameters for the parallel compression module.

In some embodiments, the computer-readable medium comprises code for extracting a first audio signal x(t) 702, said first audio signal comprising a plurality of channels corresponding to varying frequencies, where the first audio signal is the source signal.

In some embodiments, the computer-readable medium comprises code for extracting a second audio signal $x_0(t)$ 703, said second audio signal comprising a plurality of channels corresponding to varying frequencies, where the second audio signal is the noise signal.

In some embodiments, the computer-readable medium comprises code for feeding the first audio signal through a first Frequency Analysis Module 704 where the first audio signal is broken down into separate frequency components corresponding to varying frequencies.

In some embodiments, the computer-readable medium comprises code for feeding the second audio signal through a second Frequency Analysis Module 705 where the second audio signal is broken down into separate components corresponding to varying frequencies.

In some embodiments, the computer-readable medium comprises code for identifying a source component, wherein the source band is a particular component of the first audio signal 750.

In some embodiments, the computer-readable medium comprises code for identifying a corresponding noise component 751, wherein the noise component is a particular component of the second audio signal at the same frequency as the source component.

In some embodiments, the computer-readable medium comprises code for computing the power value of the source component 706.

In some embodiments, the computer-readable medium comprises code for computing the power value of the noise component 707.

In some embodiments, the computer-readable medium comprises code for using the power value of the source component and the power value of the noise component to select parameters for a parallel compression module 708.

In some embodiments, the computer-readable medium comprises code for compressing the source component of the first audio signal using parallel compression according to the parameter settings selected 709.

In some embodiments, the parallel compression code consists of code for linear compression 112, which applies gains to the first audio signal according to the equation $$G=g0+(P-T)*(1/R+1),$$

where G is the gain in dB to be applied to a frequency component of the first audio signal, P is the sound intensity of the frequency component in dB, g0 is the makeup gain in dB, T is the threshold in dB, and R is the compression ratio of the linear compression.

In some embodiments, the parallel compression code consists of code for a summation 110, which combines the resulting amplified first audio signal component with the original first audio signal component.

In some embodiments, the computer-readable medium comprises code for feeding the resulting compressed components of the first audio signal through a Frequency Synthesis Module 710 producing a corrected audio signal $x_{out}(t)$.

In some embodiments, the First 204 and Second 205 Frequency Analysis Modules are composed of a digital filter banks 304, 305 of filters and output and the frequency components comprise time-domain arrays of band-limited frequency channels for the first 002 and second 003 audio signals, and where the Frequency Synthesis Module is a summer block that summers together the channels of the audio signals after gains have been applied.

In some embodiments, the First and second Frequency Analysis Modules are digital filter banks composed of wavelet filters.

In some embodiments, the various channels correspond to critical bands of hearing.

In some embodiments, the First and Second Frequency Analysis Modules perform a Fourier transform on the input signals producing X(f) and $X_0(f)$, where the power of each component is found by squaring the Fourier component, and the Frequency Synthesis Module performs an inverse Fourier transform, resulting in output signal $x_{out}(t)$.

In some embodiments, the frequency components are grouped together to approximate sub-bands correspond to critical bands of hearing.

In some embodiments, the plurality of desired dynamic range compression curves approximate the ideal compression curves needed to compensate for a plurality of ambient noise signal intensities, so that the derived parallel compression parameters correspond to a plurality of ambient noise loudness levels.

In some embodiments, discrete sets of parameters are found by dividing the range of possible noise signal intensities into discrete levels, and where sets of parameters are found for each discrete noise intensity level, where the parameter estimation module 211 is a lookup table, where during real-time processing the ambient noise intensity is measured and used to select the corresponding set of parameters.

In some embodiments, the parameter estimation module 211 is a polynomial continuous curve defining the relationship between the ambient noise loudness and each of the parameters, where polynomial regression is used to find parameters which define this curve, where these parameters are then stored in memory.

In some embodiments, one or more parameters (e.g. T) is defined as a function of the ambient noise intensity (e.g. $T=P_N-T'$, where $P_N$ is noise loudness), such that the parameters stored (e.g. T') are the parameters of the function defining the relationship between sound intensity (e.g. $P_N$) and the parameter (e.g. T) of the parallel compression.

In some embodiments, the gain equation is expressed as a function of the difference between signal intensity and noise intensity:

$$G=g0+(dP-T')/R-dP$$

where dP is the difference between the signal intensity and noise intensity in decibels, and T' is the threshold offset from the ambient noise intensity to the threshold T.

In some embodiments, a fixed set of parameters is used.

In some embodiments, the fixed parameters fall in the range of 2 to 6 for compression ratio, 15 dB to 25 dB for makeup gain, and −15 to −25 dB for threshold offset.

In some embodiments, the computer readable medium stores a set of code instructions for a psychoacoustic model comprises a formula which computes the gain as a function of the signal and ambient noise levels which is needed to make the sound appear as loud as if the noise was not present, this formula comprising:

$$G = \frac{\sqrt[\alpha]{P_{SIG}^2 + P_{NOISE}^2 - P_{THRQ}^2}}{P_{SIG}}$$

where G is the gain ratio, $P_{SIG}$ is the signal intensity at a frequency in units of power, $P_{NOISE}$ is the signal intensity of the background noise, $P_{THRQ}$ is the absolute threshold of hearing, and $\alpha=0.2$ is a constant.

In some embodiments, the audio signal comprises a plurality of channels corresponding to various frequencies and wherein a corrective gain corresponding to each respective channel is processed and applied to each respective channel before summation.

In some embodiments, the audio signal comprises a plurality of channels corresponding to various frequencies and wherein a corrective gain corresponding to each respective channel is processed and applied to each respective channel before summation.

In some embodiments, parts of the process are performed for each frequency channel or component in series and other parts are performed in parallel.

As used herein, the term "about" refers to plus or minus 10% of the referenced number. For example, an embodiment wherein the frequency is about 1,000 Hz includes an embodiment wherein the frequency is 900 to 1,100 Hz.

Various modifications of the invention, in addition to those described herein, will be apparent to those skilled in the art from the foregoing description. Such modifications are also intended to fall within the scope of the invention. Each reference cited in the present application is incorporated herein by reference in its entirety.

Although there has been shown and described the preferred embodiment of the present invention, it will be readily apparent to those skilled in the art that modifications may be made thereto which do not exceed the scope of the invention.

What is claimed:

1. An apparatus (200), effective in producing corrections to an audio signal which is a signal of interest, across a spectrum of frequencies, by applying corrective gains of amplitude to a plurality of frequency components which constitute the audio signal, wherein parallel compression is used to approximate gain curves derived from a psychoacoustic model, wherein the parallel compression is implemented by applying a gain G at a particular frequency component of the audio signal according to a linear compression and then combining this compressed signal with the audio signal, such that the combined parallel compression of the audio signal forms a non-linear compression curve, where the linear compression is found by the equation, $G=g0+(P-T)*(1/R-1)$ where G is the gain in dB to be applied to the audio signal, where g0 is a makeup gain in dB, T is a threshold in dB, and R is a compression ratio, and where P is a sound intensity in dB of the audio signal at a frequency component, such that g0, T, and R are parameters that vary the shape of a resulting parallel compression curve, where the psychoacoustic model takes as inputs the audio signal loudness and an ambient noise signal loudness, where the model computes the gain in sound loudness, at a given frequency component, required to correct for the effect of the ambient noise signal, where the parameters g0, T, and R, for a plurality of noise loudness levels, are predetermined by fitting the parallel compression curves against the desired behavior, where a different set of parameters is retrieved at each instant depending on the ambient noise volume at each frequency component, where the dynamically changing noise loudness results in a dynamically changing selection of parameters for the parallel compression module, the apparatus (200) comprising:

(a) a first audio device (202), configured to extract a first audio signal (002) where the first audio signal is a broadband audio signal of interest, the first audio device operatively connected to a microprocessor (201);

(b) a second audio device (203), configured for extracting a second audio signal (003) where the second audio signal (003) is ambient broadband noise audio in the environment, the second audio device (203) operatively connected to the microprocessor (201);

(c) the microprocessor (201), configured to execute applications for:

i. a first frequency analysis module (204), configured to extract a plurality of frequency components from the first audio signal (002), ii. a second frequency analysis module (205), configured to extract a plurality of frequency components from the second audio signal (003), iii. a first power estimation block (206), configured to calculate a sound intensity in decibels of each frequency component of the first audio signal (002), iv. a second power estimation block (207), configured to calculate a sound intensity of decibels of each frequency component of the second audio signal (003), v. a parameter estimation module (211), which determines parameter settings for a parallel compression module, according to information stored in memory, vi. the parallel compression module (209), parameterized by parameters including a threshold T, a compression ratio R, and a makeup gain g0, where said parameters may by dynamically varied, where the parallel compression module is comprised of:

a. a linear compression module (112), which, using the parameters applies gains to the first audio signal according to the equation $G=g0+(P-T)*(1/R+1)$, where G is the gain in dB to be applied to a frequency component of the first audio signal, P is the sound intensity of the first signal at the frequency component in dB, g0 is the makeup gain in dB, T is the threshold in dB, and R is the compression ratio of the linear compression, b. a summer (110), which combines the resulting amplified first audio signal component with the original first audio signal component, vii. a Frequency Synthesis Module (210), which combines the frequency components of the resulting first audio signal, wherein (i) the first audio device (202) extracts the first audio signal (002), whereupon the first audio signal (002) is then transmitted through a first analog to digital converter (71), thereby converting the first audio signal (002) into digital format, and simultaneously, (ii) the second audio device (203) extracts the second audio signal (003), where said second audio signal (003) is then transmitted through a second analog to digital converter (72) thereby converting the second audio signal (003) into digital format, whereupon the first audio signal x(t) (002) and the second audio signal xo(t) (003) are fed, respectively, through the First Frequency Analysis Module (204) and Second Frequency Analysis Module (205) breaking down each respective audio signal into arrays of frequency components, whereupon, for each frequency component, the first audio signal (002) and the second audio signal (003) are fed, respectively, through the first Power Estimation Block (206) and Second Power Estimation Block (207), resulting in estimates, for each frequency component, and at each instant, for the sound intensity of each signal in decibels, whereupon, for each frequency component, and at each instant, the microprocessor (201), using the power estimates of the frequency components of the first (002) and second (003) audio signals, obtains parameters for parallel compression (211), depending on the sound intensity of the second audio signal (003) at each instant, whereupon the microprocessor (201), applies the parameters to the parallel compression module (209), whereupon the parallel compression module (209) applies linear compression, according to the selected parameters, to each of the frequency components of the first audio signal (002), whereupon the parallel compression module (209) sums each frequency component of the first audio signal (002) with the corresponding compressed audio signal, whereupon the microprocessor (201) repeats the process of estimating the power of both the first audio signal and the second audio signal, selecting compression settings, and applying parallel compression for each frequency component of the first audio signal (002), whereupon the microprocessor (201) reconstitutes the first audio signal (002) by feeding the now parallel compressed frequency components of the parallel compressed first audio signal (002) through the Frequency Synthesis Module (210), thereby obtaining an output Xout (t).

2. The apparatus of claim 1, where the First (204) and Second (205) Frequency Analysis Modules are composed of a digital filter banks (304), (305) of filters and output and the frequency components comprise time-domain arrays of band-limited frequency channels for the first (002) and second (003) audio signals, and where the Frequency Synthesis Module is a summer block that summers together the channels of the audio signals after gains have been applied.

3. The apparatus of claim 2, where the frequency sub-bands correspond to critical bands of hearing.

4. The apparatus of claim 1, where the First and second Frequency Analysis Modules are digital filter banks composed of wavelet filters.

5. The apparatus of claim 1, where the First (204) and Second (205) Frequency Analysis modules are composed of FFT co-processors (411) and the frequency components comprise output Fourier transform components for the first (002) and second (003) audio signals, and where the Frequency Synthesis Module (210) is an IFFT co-processor (410).

6. The apparatus of claim 5, where the frequency components are grouped together to approximate sub-bands correspond to critical bands of hearing.

7. The apparatus of claim 1, where a plurality of desired dynamic range compression curves approximate the ideal compression curves needed to compensate for a plurality of ambient noise signal intensities, so that the derived parallel compression parameters correspond to a plurality of ambient noise loudness levels.

8. The apparatus of claim 1 or claim 7, where discrete sets of parameters are found by dividing the range of possible noise volumes into discrete levels, and where sets of parameters are found for each discrete noise loudness level, where the parameter estimation module (211) is a lookup table, where during real-time processing the ambient noise intensity is measured and used to select the corresponding set of parameters.

9. The apparatus of claim 1 or claim 7, where the parameter estimation module (211) is a polynomial continuous curve defining the relationship between the ambient noise loudness and each of the parameters, where polynomial regression is used to find parameters which define this curve, where these parameters are then stored in memory, so that during processing the parameters can then be computed using a polynomial equation.

10. The apparatus of claim 1 or claim 7, where one or more parameters (e.g. T) is defined as a function of the ambient noise intensity (e.g. T=PN−T', where PN is noise loudness), such that the parameters stored (e.g. T') are the parameters of the function defining the relationship between sound intensity (e.g. PN) and the parameter (e.g. T) of the parallel compression.

11. The apparatus of claim 1 or claim 7, where the gain equation is expressed as a function of the difference between signal intensity and noise intensity:

G=g0+(dP−T')/R−dP where dP is the difference between the signal loudness and noise loudness in decibels, and T' is the threshold offset from the ambient noise intensity to the threshold T.

12. The apparatus of claim 1, where a fixed set of parameters is used.

13. The apparatus of claim 1, where the fixed parameters fall in the range of 2 to 6 for compression ratio, 15 dB to 25 dB for makeup gain, and −15 to −25 dB for threshold offset.

14. The apparatus of claim 1, wherein the apparatus is a mobile phone, media player, or headset.

15. The apparatus of claim 1, wherein the processing of all frequency components of both signals are computed in parallel using multiple processing units, such as on a parallel processing device.

16. The apparatus of claim 1, where the psychoacoustic model comprises a formula which computes the gain as a function of the signal and ambient noise levels which is needed to make the sound appear as loud as if the noise was not present, this formula comprising:

where G is the gain ratio, PSI G is the signal intensity at a frequency in units of power, PNOI SE is the signal intensity of the background noise, PTHRQ is the absolute threshold of hearing, and a=0.2 is a constant.

17. A method of using parallel compression to approximate a desired non-linear dynamic range compression curve, wherein a compression curve defines the output loudness in decibels versus the input loudness in decibels of a signal of interest, wherein the compression is implemented by applying a gain G to the signal of interest according to the following equation:

G=g0+(P−T)*(1/R−1) where G is the gain in dB to be applied to a frequency component of the signal of interest, P is the sound intensity of the frequency component in dB, g0 is the makeup gain in dB, T is the threshold in dB, and R is the compression ratio of linear compression, whereupon the linearly compressed signal is added together with the original signal of interest, producing a parallel compressed output signal, where the overall amplitude of the input versus the output signal defines a parallel compression curve, where g0, T, and R are thus parameters that vary the shape of the parallel compression curve, and P is the input loudness of the signal of interest, where the method is comprised of the following steps:

a. obtaining parameters that shape the parallel compression curve, by fitting compression curves using these parameters against a plurality of desired compression curves and selecting the parameters that minimize the difference between the compression curve of the parallel compression module and each of the desired compression curves; b. storing the optimal sets of parameters in a memory device; c. during real-time processing, at each time step: 1. retrieving a set of parameters, depending on the desired compression curve to be used, 2. applying the set of parameters, to the parallel compression module, and processing a first audio signal using the time-varying compression parameters in the parallel compression module, where the parallel compression module is performed by: a. applying linear compression to the first audio signal according to the equation G=g0+(P−T)*(1/R+1), producing a linearly compressed audio signal, and b. summing the linearly compressed audio signal with the first audio signal.

18. The method of claim 17, where the plurality of desired dynamic range compression curves approximate the ideal compression curves needed to compensate for a plurality of ambient noise signal intensities, so that the derived parallel compression parameters correspond to a plurality of ambient noise loudness levels.

19. The method of claim 18, where discrete sets of parameters are found by dividing the range of possible noise volumes into discrete levels, and where sets of parameters are found for each discrete noise loudness level, where the sets of parallel compression parameters are stored in a lookup table, and where during real-time processing the ambient noise intensity is measured and used to select the corresponding set of parameters.

20. The method of claim 18, where polynomial regression is used to fit a continuous curve between the ambient noise loudness and each of the parameters, where the parameters of this curve are stored, and where during real time processing the ambient noise loudness is measured and applied to the polynomial function to obtain each parameter T, R, and g0.

* * * * *